(12) United States Patent
Petrovic et al.

(10) Patent No.: US 12,294,386 B2
(45) Date of Patent: May 6, 2025

(54) OPTIMIZATIONS OF MEMORY-UTILIZATION AND PCM PROCESSING SCHEDULES FOR AN LDPC DECODER

(71) Applicant: TANNERA TECHNOLOGIES DOO, Belgrade (RS)

(72) Inventors: Vladimir Petrovic, Belgrade (RS); Dragomir El Mezeni, Belgrade (RS); Milos Markovic, Belgrade (RS)

(73) Assignee: TANNERA TECHNOLOGIES DOO, Belgrade (RS)

( * ) Notice: Subject to any disclaimer, the term of this patent is extended or adjusted under 35 U.S.C. 154(b) by 0 days.

(21) Appl. No.: 18/243,598

(22) Filed: Sep. 7, 2023

(65) Prior Publication Data

US 2025/0070797 A1    Feb. 27, 2025

(30) Foreign Application Priority Data

Aug. 25, 2023 (EP) .................................. 23193404

(51) Int. Cl.
*H03M 13/11* (2006.01)
*H03M 13/37* (2006.01)

(52) U.S. Cl.
CPC .... *H03M 13/1148* (2013.01); *H03M 13/1105* (2013.01); *H03M 13/1111* (2013.01); *H03M 13/114* (2013.01); *H03M 13/116* (2013.01); *H03M 13/1162* (2013.01); *H03M 13/1165* (2013.01); *H03M 13/118* (2013.01); *H03M 13/3707* (2013.01); *H03M 13/3746* (2013.01)

(58) Field of Classification Search
CPC .......... H03M 13/1148; H03M 13/1111; H03M 13/3746; H03M 13/116; H03M 13/1162; H03M 13/1165; H03M 13/114; H03M 13/118; H03M 13/1105; H03M 13/3707
USPC ........................................ 714/746, 752, 755
See application file for complete search history.

(56) References Cited

U.S. PATENT DOCUMENTS

| 7,383,493 B2 * | 6/2008 | Shen ................. H03M 13/1102 714/801 |
| 9,614,548 B1 * | 4/2017 | Nguyen ............ H03M 13/1108 |
| 2004/0252791 A1 * | 12/2004 | Shen .................... H04L 1/0041 375/340 |

(Continued)

OTHER PUBLICATIONS

Petrović et al., "Flexible High Throughput QC-LDPC Decoder With Perfect Pipeline Conflicts Resolution and Efficient Hardware Utilization", Dec. 2020, IEEE, vol. 67, Issue: 12, pp. 5454-5467. (Year: 2020).*

(Continued)

*Primary Examiner* — John J Tabone, Jr.
(74) *Attorney, Agent, or Firm* — The Watson IP Group, PLC; Jovan N. Jovanovic

(57) ABSTRACT

The disclosure generally relates to improvements of a log-likelihood ratios (LLRs) memory structure and memory capacity of a decoding hardware (also referred to as a decoder) in decoding a sequence of codewords encoded with a low-density parity-check (LDPC) code (e.g. a quasi-cyclic (QC) LDPC code). Further, the disclosure relates to the optimization of a processing schedule of a parity check matrix (PCM) describing the LDPC code so as to reduce or minimize the number of patch LLRs that need to be (simultaneously) stored in an LLR memory of a decoder.

14 Claims, 13 Drawing Sheets

(56) References Cited

U.S. PATENT DOCUMENTS

| | | | |
|---|---|---|---|
| 2005/0028071 A1* | 2/2005 | Shen | H04L 1/0058 |
| | | | 714/800 |
| 2005/0257116 A1* | 11/2005 | Zarrinkhat | H03M 13/1148 |
| | | | 714/755 |
| 2006/0195765 A1* | 8/2006 | Coffey | H03M 13/2957 |
| | | | 714/760 |
| 2019/0340071 A1* | 11/2019 | Bhatia | G06F 11/1076 |
| 2019/0372593 A1* | 12/2019 | Shirazinia | H03M 13/116 |
| 2021/0281279 A1* | 9/2021 | Jang | H03M 13/6362 |
| 2022/0085828 A1* | 3/2022 | Declercq | H03M 13/1122 |

OTHER PUBLICATIONS

Petrović, Flexible Encoder and Decoder of Low-Density Parity-Check Codes, Nov. 15-16, 2022, IEEE, pp. 1-2. (Year: 2022).*

* cited by examiner

OPTIMIZATIONS OF MEMORY-UTILIZATION AND PCM PROCESSING SCHEDULES FOR AN LDPC DECODER

TECHNICAL FIELD

Embodiments of the disclosure generally relate to improvements of a log-likelihood ratios (LLRs) memory structure and memory capacity of a decoding hardware (also referred to as a decoder) in decoding a sequence of codewords encoded with a low-density parity-check (LDPC) code (e.g. a quasi-cyclic (QC) LDPC code). Further embodiments of the disclosure relate to the optimization of a processing schedule of a parity check matrix (PCM) describing the LDPC code so as to reduce or minimize the number of patch LLRs that need to be (simultaneously) stored in an LLR memory of a decoder.

BACKGROUND

This disclosure is based on and extends on the Petrović et al., "Flexible High Throughput QC-LDPC Decoder With Perfect Pipeline Conflicts Resolution and Efficient Hardware Utilization", IEEE Transactions on Circuits and Systems I: Regular Papers, Volume: 67, Issue: 12, Page(s): 5454-5467, December 2020, which is incorporated herein in its entirety. Please note that the notations as used by Petrović et al. (see Table I) are also used in this disclosure.

Communication standards, such as 5G new radio (5G NR), require a high-speed decoder for highly irregular quasi-cyclic low-density parity-check (QC-LDPC) codes. A widely used approach in QC-LDPC decoders is a layered decoding schedule that processes the parity check matrix in parts, thus providing faster convergence. However, pipelined layered decoding architecture suffers from data hazards that reduce the throughput. Petrović et al. present an architecture of a decoder, which can facilitate any QC-LDPC decoding without stall cycles caused by pipeline hazards. The decoder conveniently incorporates both the layered and the flooding schedules in cases when hazards occur. The proposed decoder architecture enables the insertion of a large number of pipeline stages, thus providing a high operating frequency.

BRIEF SUMMARY OF THE DISCLOSURE

This Brief Summary is provided to introduce a selection of concepts in a simplified form that are further described below in the Detailed Description. This Summary is not intended to identify key features or essential features of the claimed subject matter.

One aspect of the disclosure related to the minimization of memory requirements of a decoding hardware (also referred to as a decoder) in decoding a sequence of codewords encoded with a low-density parity-check (LDPC) code (e.g. a quasi-cyclic (QC) LDPC code). Such decoder may have a layered decoder structure and may use double buffering for optimizing the utilization of the decoding hardware. Conventionally, LDPC codes can be represented using a parity check matrix (PCM) that yields variable nodes and check nodes of a message passing decoding algorithm and their interconnections in the corresponding Tanner graph. The processing the PCM in layers to decode a codeword, the PCM in its original form yields pipeline conflicts that can occur in the decoding process (e.g. calculation of variable-to-check messages for some variable nodes might require LLR values not yet written (back) into the decoding memory block, so that outdated LLR values might be read from memory of the calculation). Some of these pipeline conflicts usually remain even when optimizing the PCM processing schedule in an attempt to avoid such pipeline conflicts. According to said aspect of the disclosure, the (remaining) pipeline conflicts may be known in advance (e.g. the LDPC code and/or its PCM may be known) and hence it is possible to determine situations where variable nodes might read outdated LLRs from memory in the calculation of variable-to-check messages in the processing of the layers of the PCM. As those situations can be determined for an (optimized) PCM processing schedule in advance, it is possible to ensure that the required latest and most up to date LLR values (also denoted "patch LLRs" herein) for the calculation of the variable-to-check messages are buffered in a second memory block that feeds the latest and most up to date LLR values to an LLR update unit in time for the update of the LLRs for the affected variable nodes.

Embodiments of the disclosure relate to an apparatus implementing a decoder. The decoder is to decode a sequence of codewords encoded with a LDPC code (e.g. a quasi-cyclic (QC)-LDPC code or another LDPC code that has a sparse PCM . . . ) using an iterative hybrid decoding algorithm. The hybrid decoding algorithm may use a hybrid decoding schedule as described in this disclosure. The iterative hybrid decoding algorithm is based on passing messages between variable nodes and check nodes to decode a current codeword of the sequence of codewords in layers. The layers corresponding to portions of a parity check matrix (PCM) describing the LDPC code. For example, a "portion" of the PCM may refer to one or more rows of the PCM, where columns of the PCM correspond to variable nodes and rows of the PCM correspond to check nodes. In some example, the number of rows of one layer may correspond to the circulant size/lifting size of a base graph matrix used to represent the PCM, or an integer fraction of the circulant size/lifting size. In alternative examples, the "portions" of the PCM forming layers may correspond to one or more rows of the PCM and only a subset of the columns of the PCM. The iterative hybrid decoding algorithm includes a plurality of updates of log-likelihood ratios (LLRs) of a current codeword in decoding the current codeword. In some examples, the column weight (i.e. the number of non-zero entries in each column) of each layer may be 1; however, the column weight may also be >1.

The decoder comprises an LLR update unit. The LLR update unit may be for example implemented by a plurality of processing elements. The LLR update unit calculates, in processing a current layer of said layers of the PCM, updated LLRs of the current codeword for those variable nodes for which the current layer of the PCM includes non-zero entries. Note that when layering the PCM for example into one or more rows, the processing of one layer of the PCM may not necessarily lead to LLRs updates for all variable nodes due to the (commonly) sparse nature of the PCM.

Further, the decoder includes an LLR memory, which is divided into a first memory block and a second memory block. The first memory block is to store the most recent updated LLRs of the current codeword. The second memory block stores, as patch LLRs, most recent updated LLRs associated with a subset of the variable nodes for which a PCM processing schedule yields that variable-to-check messages from said associated variable nodes calculated in processing the current layer are not based on the most recent LLRs. Optionally, the second memory block of the LLR memory may store the patch LLRs and further the LLRs of the next codeword.

As explained above, the reading of outdated data from the first memory block for the calculation of variable-to-check messages could be due to pipeline latency, i.e. the processing of the current layer uses data which has not yet been updated in the first memory block due to the pipeline latency. The most recent updated LLRs may be—for example—the updated LLR for a variable node from a previously processed layer (e.g. if the current layer is denoted with the index l, the previous layer could be layer l−1, but could also be an even earlier processed layer l−n with n>1—e.g. depending on the code and/or pipeline depth of the decoder in the path containing the variable node units (VNUs) and check node units (CNUs) as outlined below in more detail).

In a further example embodiment, the decoder further comprises a controller configured to cause storage of an updated LLR for a variable node that is updated by the LLR update unit in processing a previous layer in the LLR memory. The controller ensures that the updated LLR for said variable node is stored:
- as one of the most recent updated LLRs of the current codeword in the first memory block only, if PCM processing schedule yields that a variable-to-check message from said variable node calculated in processing the current layer is based on the most recent LLR associated with said variable node; and
- as one of the most recent updated LLRs of the current codeword in the first memory block and as one of the patch LLRs in the second memory block ("double write"), if PCM processing schedule yields that a variable-to-check message from said variable node calculated in processing the current layer is not based on the most recent LLR associated with said variable node.

Another aspect of the disclosure, which can be combined with the previously mentioned aspect of the disclosure, relates to the optimization of the processing schedule of the PCM describing the LDPC code so as to reduce or minimize the number of patch LLRs that need to be (simultaneously) stored in an LLR memory of a decoder. The optimization of the processing schedule for the decoding process can thus help to decrease the required memory capacity for storing the patch LLRs in the LLR memory of the decoder. Some embodiments of this disclosure utilize such optimizations of the PCM or read/write scheduling in the decoder to minimize the maximum number of stall cycles, i.e. to minimize the maximum number of potential pipeline conflicts that can occur in the decoding of the codeword or portion thereof. Another or alternative embodiments optimized the processing schedule of the PCM to reduce or minimize the number of patch LLRs that need to be concurrently held in the LLR memory for "patch updates" of the LLR values in the LLR update unit. In another example embodiment, the PCM processing schedule is an optimized PCM processing schedule that is optimized based on a genetic algorithm (GA) or another algorithm suitable for solving a clustered traveling salesman problem (CTSP). In a further example embodiment, the PCM processing schedule is an optimized PCM processing schedule (e.g. optimized based on a GA) that yields a minimum number of variable-to-check messages from variable nodes calculated in processing all layers that are not based on the most recent LLR associated with said variable node. Note that the processing of all layers of the PCM may be considered one iteration of the decoding process. In yet another example embodiment, the PCM processing schedule is an optimized PCM processing schedule (e.g. optimized based on a GA) that yields a minimum number of patch LLRs that need to be stored concurrently for processing all layers in decoding the current codeword.

In some example embodiments, the decoder may be implemented in a field-programmable gate array (FPGA) or a programmable logic device (PLD). The FPGA/PLD may also be part of a system-on-chip (SoC) or system-in-package (SiP), but the disclosure is not limited in this respect. In those embodiments, the first and second memory blocks of the LLR memory may be for example realized by equal numbers of fixed-size block RAMs. The number of bits that can be stored in said number of block RAMs is smaller than the size of two times the bits required to store LLRs of the largest codeword length to be decoded by the apparatus. Accordingly, in comparison to a double buffering approach where all updated LLRs are stored redundantly in the second memory block for patching, the size of the memory required in this embodiment can be reduced significantly.

When implementing the decoder using FPGA or PLD resources, the processing elements may be hardware elements of the FPGA/PLD. For example, the processing elements may be formed by one or more elements selected from a group of elements, the group comprising: look-up tables (LUT), registers (e.g. flip-flops), multiply-accumulate (MAC) blocks, digital signal processor (DSP) blocks, Adaptive Logic Modules (ALM) blocks, etc. The processing elements formed using the FPGA/PLD resources may be used to implement the LLR update unit, and/or variable node units (VNUs) and check node units (CNUs) outlined below. Note that the LLR update unit may be realized for example by individual update units for each LLR value corresponding to respective one of the variable nodes.

In alternative example embodiments, the decoder may also be implemented in an application specific integrated circuit (ASIC). The ASIC may also be part of a system-on-chip (SoC) or system-in-package (SiP), but the disclosure is not limited in this respect. In this case, the first and second memory blocks of the LLR memory are realized by equal numbers of memory elements provided in the ASIC. When implementing the decoder using ASIC resources, the processing elements may be hardware elements of the ASIC. For example, the processing elements may be formed by individual circuits that implement the desired functionality of—for example—the LLR update unit, and/or variable node units (VNUs) and check node units (CNUs) outlined below.

In some example implementations, the LLR memory of the ASIC could comprise two memory blocks. In these example implementations, the number of bits that can be stored in the number memory elements of the ASIC is smaller than the size of two times the bits required to store LLRs of the largest codeword length to be decoded by the apparatus. For example, the first and second memory blocks of the LLR memory could be realized by memory elements provided in the ASIC, wherein the number of bits that can be stored in the second memory block is smaller than the size of the bits required to store LLRs of the largest codeword length to be decoded by the apparatus.

In a further example that may be used in FPGA-, PLD- and also ASIC-based implementation and is not limited to those implementations, each of the first and second memory blocks consists of a first memory portion having a number of bits equal to the number of bits required to store the values of the LLRs of the current or next codeword, respectively, and a second portion having a number of bits that is smaller than that of the first portion to store said patch LLRs for the variable nodes prior to their update. Moreover, decoder/controller may be configured to access the second portion of the memory block using a virtual addressing scheme. In another embodiment, each of the entire first and second memory blocks may be addressed using a virtual addressing scheme or the entire first and second memory blocks may share a virtual address space.

In some alternative example implementations, a separate memory block of the ASIC could be used to store the patch LLR values, so that there are three memory blocks in the LLR memory of the decoder. In those example implementations, the LLR memory includes a third memory block realized by memory elements provided in the ASIC. The third memory block is to store and LLRs of the next codeword and number of bits that can be stored in the first and third memory blocks, respectively, is the number of the bits required to store LLRs of the largest codeword length to be decoded by the apparatus. The decoder/controller may be further configured to access the second memory block (which stores the patch LLRs) using a virtual addressing scheme.

In yet further embodiments, each of the memory blocks of the LLR memory has a read port and a write port to read and write values of the LLRs from/to the two memory blocks of the LLR memory.

In some further embodiments, the "roles" of the first and second memory blocks of the LLR memory are switched when the next codeword is to be decoded.

Considering the codewords to be even and odd codewords in sequence, the decoder is configured to:
  when the current codeword of the sequence of codewords is an odd codeword, store the updated LLRs of the odd codeword in a first memory block, and to store the LLRs of the next even codeword and said patch LLRs in the second memory block; and
  when the current codeword of the sequence of codewords is an even codeword, store the updated LLRs of the odd codeword in the second memory block, and store the LLRs of the next even codeword and said patch LLRs in the first memory block.

In some example implementations, the decoder may be further configured to:
  when the current codeword of said sequence of codewords is an odd codeword, read the updated LLRs of a previous even codeword from the second memory block, and to subsequently store the LLRs of the next even codeword in the second memory block, while decoding the odd codeword; and
  when the current codeword of said sequence of codewords is an even codeword, read the updated LLRs of a previous odd codeword from the first memory block, and to subsequently store the LLRs of the next odd codeword in the first memory block, while decoding the even codeword.

According to a further embodiment, the decoder further comprises a first routing block having two input ports connected to two read ports of the memory blocks of the LLR memory and configurable to provide data from a selected one of the read ports to a selected one of output ports of the first routing block, wherein one of the output ports of the first routing block is connected to variable node units (VNUs) implementing the variable nodes.

According to another further embodiment, the decoder further comprises a second routing block having two output ports connected to two write ports of the two memory blocks of the LLR memory and configurable to provide data from a selected one of two input ports of the second routing block to a selected one of two output ports of the second routing block, wherein one of the input ports of the second routing block receives the updated LLRs, and the other one of the input ports receives the LLRs of the next codeword and/or the patch LLRs.

According to yet another embodiment, the LLR update unit may be configured to calculate, in a current iteration, one or more updated LLRs for each of the variable nodes. The one or more updated LLRs for each of the variable nodes may be calculated by either:
  adding a variable-to-check message from the respective variable node generated in processing of the current layer in the current iteration and a check-to-variable message to the respective variable node in the current iteration, if PCM processing schedule yields that a variable-to-check message from the respective variable node calculated in processing the current layer is based on the most recent LLR associated with said variable node; or
  adding a patch LLR corresponding to the respective variable node received from the second memory block of the LLR memory and a difference between the check-to-variable message to the respective variable node generated in the current iteration and a check-to-variable message to the respective variable node generated in a previous iteration, if PCM processing schedule yields that a variable-to-check message from the respective variable node calculated in processing the current layer is not based on the most recent LLR associated with said variable node.

In this implementation, the LLR update unit may be configured to update the current LLRs without stalling execution cycles or postponing the LLR updates. If PCM processing schedule yields that a variable-to-check message from the respective variable node calculated in processing the current layer is not based on the most recent LLR associated with said variable node (e.g. due to a pipeline conflict) the LLR update for the variable node may be performed using the check-to-variable message to the respective variable node generated in a previous iteration so that the "contribution" of this check-to-variable message is not lost. This may lead to regular updates of the LLR values without loosing of contributions to the iterative decoding process due to pipeline conflicts, which may also lead to faster convergence of the decoding result for a codeword, which may in turn improve the decoding speed since the average number of clock cycles for decoding of a codewords may be reduced. Such a solution may also provide the possibility to increase the number of pipeline stages to the point where clock frequency is very high and thus further improve the decoding speed.

In another embodiment, the decoder may further comprise variable node units (VNUs). The VNUs may be configured to load current LLRs of the current codeword from the first memory block of the LLR memory and to calculate variable-to-check messages based on the loaded current LLRs corresponding to the respective variable nodes and check-to-variable messages to the respective variable nodes calculated in the previous iteration. The decoder may further comprise check node units (CNUs) implementing the check nodes. The CNUs may be configured to receive, in the current iteration, the variable-to-check messages from the VNUs, and to calculate check-to-variable messages of the current iteration based on variable-to-check messages received from the VNUs. The VNUs and/or CNUs may be implemented using processing elements of the decoder.

In some embodiments, the VNUs may be configured to calculate the variable-to-check messages of the variable nodes in parallel. In some embodiments, the CNUs are configured to calculate the check-to-variable messages of the check nodes in parallel.

According to an embodiment, the CNUs are configured to perform an implementation/variant of a min-sum algorithm (MSA), but the disclosure is not limited to this algorithm and other message-passing algorithms could be used (e.g. Sum-Product Algorithm (SPA)). The CNUs may calculate, for each iteration, the check-to-variable messages based on said variable-to-check messages from the VNUs and the sign product. Optionally, the CNUs may also determine the sign product of signs of variable-to-check messages. When layers of the PCM correspond to one or more rows, a check-to-variable message is calculated for a check node every iteration.

In a further embodiment, each of the VNUs may comprise a multiplexer circuit that selectively outputs the variable-to-check message of the current iteration or a negated check-to-variable message of the previous iteration. The decoder may further have a FIFO buffer to receive, from the VNUs, the variable-to-check messages from the VNUs of the current iteration or the negated check-to-variable message of the previous iteration from the multiplexer circuit.

The number of VNUs and CNUs may depend on the size of the circulant of the PCM, e.g. for a quasi-cyclic (QC)-LDPC code. For example, the PCM of size n×m (n being the number of variable nodes; m being the number of check nodes) may be represented by concatenations of shifted versions of a Z×Z identity matrix (the so-called "circulants") and optionally Z×Z zero-matrices in the row and column direction, where Z is the size of the circulant or "lifting size", where $n/Z \in \mathbb{N}_1$ and $m/Z \in \mathbb{N}_1$ where $\mathbb{N}_1$ denotes a natural number $\geq 1$. The number of VNUs may be identical to the number of CNUs. Optionally, the number of VNUs and the number of CNUs is each equal to the lifting size.

In a further embodiment, each of the VNUs calculates a variable-to-check message for only one of the CNUs in processing a current layer. Each of the CNUs calculates a respective check-to-variable message for each of the VNUs. As noted, each of the number of VNUs/processing elements implementing the VNUs, the number of CNUs/processing elements implementing the CNUs and the number of processing elements implementing the LLR update unit can be equal to or lower than the lifting size of the PCM that represents the QC-LDPC code of the sequence of codewords. To put it different, each variable node may be considered to have an associated LLR update sub-unit that collectively form a "LLR update unit".

In some further embodiments, the decoder further comprises a buffer memory to store the check-to-variable messages to the respective variable nodes generated in a previous iteration. The LLR update unit is to receive the check-to-variable messages to the respective variable nodes from the CNUs.

In yet other embodiments, the decoder further comprises a FIFO buffer to selectively store, for the variable nodes, a check-to-variable message to a respective variable node generated in a previous iteration, if PCM processing schedule yields that a variable-to-check message from the respective variable node calculated in processing the current layer is not based on the most recent LLR associated with said respective variable node or said variable-to-check message from the respective variable node generated in processing of the current layer in the current iteration, if PCM processing schedule yields that the variable-to-check message from the respective variable node calculated in processing the current layer is based on the most recent LLR associated with said respective variable node. The LLR update unit is to receive either said check-to-variable message to the respective variable node generated in a previous iteration from the FIFO buffer, if PCM processing schedule yields that a variable-to-check message from the respective variable node calculated in processing the current layer is not based on the most recent LLR associated with said respective variable node, or said variable-to-check message from the respective variable node generated in processing of the current layer in the current iteration, if PCM processing schedule yields that the variable-to-check message from the respective variable node calculated in processing the current layer is based on the most recent LLR associated with said respective variable node.

BRIEF DESCRIPTION OF THE DRAWINGS

The present description will be better understood from the following detailed description read in light of the accompanying drawings, wherein like reference numerals are used to designate like parts in the accompanying description.

DETAILED DESCRIPTION

Figure 1:
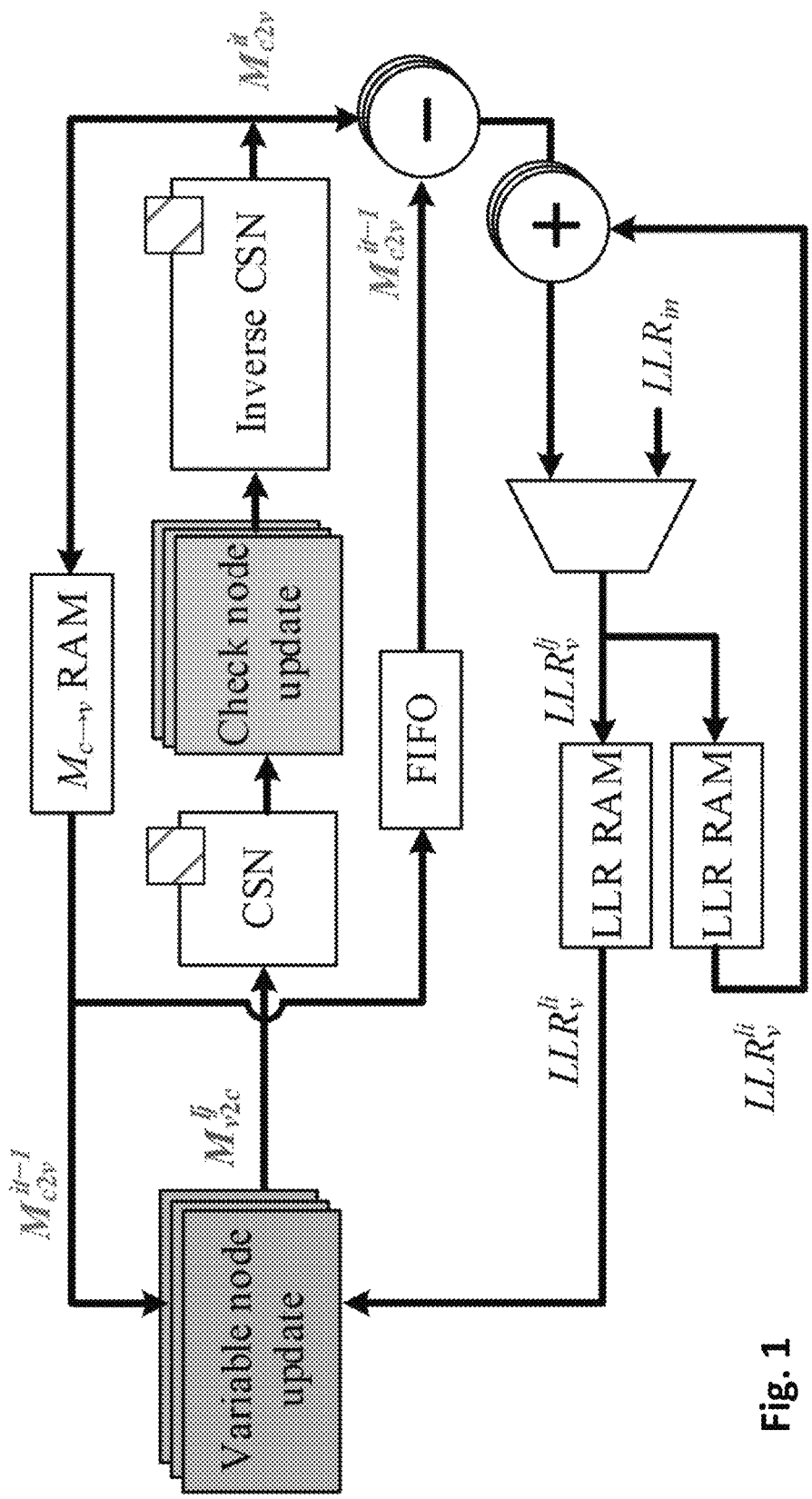
FIG. 1 shows an exemplary decoder architecture that supports LLR updates without postponing the LLR update, where the LLR update are performed by adding differences between check-to-variable messages from the current iteration and from a previous iteration in case of an outdated LLR having been read in the processing of the current layer in the current iteration.

An LDPC code is completely defined by its parity-check matrix (PCM) or the storage matrix (conventionally denoted L) corresponding to the PCM but can also be represented using the Tanner graph. LDPC code is sparse, i.e., of low density, so both the encoding and the decoding processes can be of low computation complexity. The decoding process is usually based on the iterative message-passing algorithm, which can provide very good performance in terms of achievable information rate, making LDPC codes able to closely approach the channel.

Traditionally, LDPC codes, whose connections between variable nodes and check nodes are generated randomly, provide the best achievable information rate. However, practical LDPC codes are designed to have some structural constraints in order to provide possibility for parallel processing of multiple nodes in both the encoding and the decoding processes. Quasi-cyclic (QC) LDPC code has a PCM that is composed of circularly shifted identity matrices (the so-called circulants) and optionally additional zero matrices. This code can be represented using the permutation matrix, and the width of the identity submatrix, frequently called the lifting size (Z). A base graph matrix may typically refer to a matrix of a LDPC code that has ones at circulant places and zeros at zero-matrix places. When designing an LDPC code, a base graph matrix may be determined in the beginning and the base graph matrix is then lifted to the full parity check matrix using the circulants. An intermediate step of this process is the permutation matrix. The permutation matrix may contain non-negative shift values at positions of identity sub-matrices and −1s for zero matrices, which is convenient for the storage of the code parameters (see e.g. FIG. 6, on the top on the left side).

In the message-passing algorithm, variable nodes and check nodes communicate using messages that are passed along the edges of the Tanner graph. The messages are associated with the probabilities that the corresponding bits are zero or one. The probabilities are conventionally represented by a log-likelihood ratios (LLRs). Their values are iteratively updated in the variable nodes (see section II.A of Petrović et al.). In the so-called flooding schedule, all variable nodes simultaneously pass their messages to the corresponding check nodes and all check nodes simultaneously pass their messages to the variable nodes. In the layered schedule, the PCM is viewed as a set of horizontal and/or vertical layers where each layer represents a component code. The component code may correspond to either the full codeword size or a portion of the codeword only, depending on the definition of the layers. In a single layer iteration (also referred to as a sub-iteration), messages from variable nodes to check nodes and vice versa are passed consecutively for each layer. This way, the probabilities (e.g. LLRs) are updated more frequently during a single iteration through the layer, thus speeding up the decoding process. This is particularly convenient for the QC-LDPC codes since their PCM is already naturally divided into layers. The row layered decoding (with the PCM divided in horizontal layers) is used more frequently due to more efficient memory utilization and lower computation complexity. Embodiments of this disclosure use a decoder architecture facilitating such layered schedule approach in the decoding process. A more detailed discussion of a layered decoder architecture is provided in section II.B of Petrović et al.

The decoding computations can be done serially, but such configuration provides extremely small throughputs, although the required hardware is minimal. Fully parallel decoders are the fastest but require very high amount of hardware resources, caused mainly by routing congestion, especially for long code words. Consequently, the widely accepted approach is using the partially parallel architectures that allow design tradeoffs between the obtained throughput and hardware complexity.

High throughput partially parallel LDPC decoding can be achieved mainly in two ways: 1) by increasing the operating clock frequency and 2) by increasing the number of parallel processing units. This is explained in more detail in connection with equation (12) expressing the coded throughput of the layered decoder in section II.B of Petrović et al.) which is reproduced below:

$$T = \frac{n \cdot f_{CLK}}{(n_{circ} + n_{stall}) \, it_{max} + n_{init}}, \quad (12)$$

where $f_{CLK}$ is the operating frequency, n is the codeword length, $n_{circ}$ is the number of circularly shifted identity sub matrices in the PCM, $n_{stall}$ is the number of inserted stall cycles because of the memory access pipeline conflicts or the check node weight (CNW) change, $it_{max}$ is the maximum number of iterations, and $n_{init}$ is the number of cycles needed for the preparation of all input LLRs if the new codeword LLRs are not stored in the LLR memory during the decoding of the previous codeword. The highest throughput is obviously obtained if $n_{stall}$ and $n_{init}$ are zero and if the decoding algorithm has fast convergence, i.e., if $it_{max}$ is small. The highest hardware usage efficiency is obtained if the hardware overhead necessary for the above to be fulfilled is minimal.

The operating frequency is increased primarily by pipelining. Although superior in the speed of the convergence, pipelined layered decoding hardware suffers from data dependencies between successive layers, since pipeline stages induce delays in memory write operations. Consequently, additional stall cycles need to be inserted to provide pipeline conflict resolution. Those pipeline conflicts are also denoted data hazards in this disclosure.

The number of stall cycles can be reduced using an (offline) optimization of the PCM, such as for example read/write scheduling based on the PCM reordering techniques. In general, reordering techniques may not eliminate all stall cycles, especially for less sparse permutation matrices. Some embodiments of this disclosure utilize such optimizations of the PCM or read/write scheduling in the decoder to minimize the maximum number of stall cycles, i.e. to minimize the maximum number of potential pipeline conflicts that can occur in the decoding of the codeword or portion thereof. Another or alternative embodiments optimized the processing schedule of the PCM to reduce or minimize the number of patch LLRs that need to be concurrently held in the LLR memory for "patch updates" of the LLR values in the LLR update unit.

To increase the sparsity of the permutation matrix, reducing the size of the circulant submatrices can be performed. Reducing the lifting size Z reduces the parallelism, thus increasing latency and reducing the throughput of a decoder. This is because the number of processing units that implement the functionality of the variable nodes and the number of processing units that implement the functionality of the check nodes typically corresponds to the lifting size Z. However, the necessary hardware resources are reduced and used more efficiently since stall cycles are removed, thus it effectively increases the hardware usage efficiency (HUE) expressed as the throughput divided by used hardware resources.

Embodiments of this disclosure utilize a hybrid decoding schedule, where the intrinsic LLR update in a single layer sub-iteration lj is done by the addition of the variable-to-check message $M_{v2c}^{lj}$ and newly calculated check-to-variable message $M_{c2v}^{it}$. The update can be further expanded as shown in equation (13) of Petrović et al. (see section III) reproduced below:

$$LLR_v^{lj} = M_{v2c}^{lj} + M_{c2v}^{it} = LLR_v^{li} - M_{c2v}^{it-1} + M_{c2v}^{it} \quad (13)$$
$$= LLR_v^{li} + \Delta M_{c2v},$$

where $\Delta M_{c2v}$ is the contribution of the check node c to the LLR that corresponds to the variable node v and $LLR_v^{li}$ is the LLR value of the variable node v as updated by the processing of a previous single layer sub-iteration li. If the new LLR value $LLR_v^{lj}$ is not written to the LLR memory at the moment when it is needed for calculation of another variable-to-check message $M_{v2c'}$ for another check node c', the contribution $\Delta M_{c2v}$ will be lost. For this reason, conventional layered decoder architectures commonly wait until the LLR of the variable node v is updated which introduces additional stall cycles.

The decoder architecture that supports LLR updates without postponing in accordance with an embodiment of this disclosure is shown in FIG. 1. LLR update is always achieved by adding differences between check-to variable (c2v) messages from the current iteration it and from the previous iteration it−1. In order to achieve this, the $M_{c2v}^{it-1}$ values may be passed through FIFO buffer (that may be also used for variable-to-check messages), and subtract it from the new check-to-variable messages $M_{c2v}^{it}$. This change in the decoder architecture does not increase the hardware complexity. However, since the old LLR values $LLR_v^{li}$ are necessary for the updates, it is necessary to buffer them in a separate memory block or use multi-read-port single-write-port LLR memory. In the latter case, all ports should be constantly occupied during the entire decoding for high throughput. Most FPGA platforms do not have such multi-port block memories, and would need to use two memories, as shown in FIG. 1. Since the LLR memory is the main consumer of memory resources in the LDPC decoder, doubling the LLR memory resources significantly increases the hardware complexity.

Figure 2:
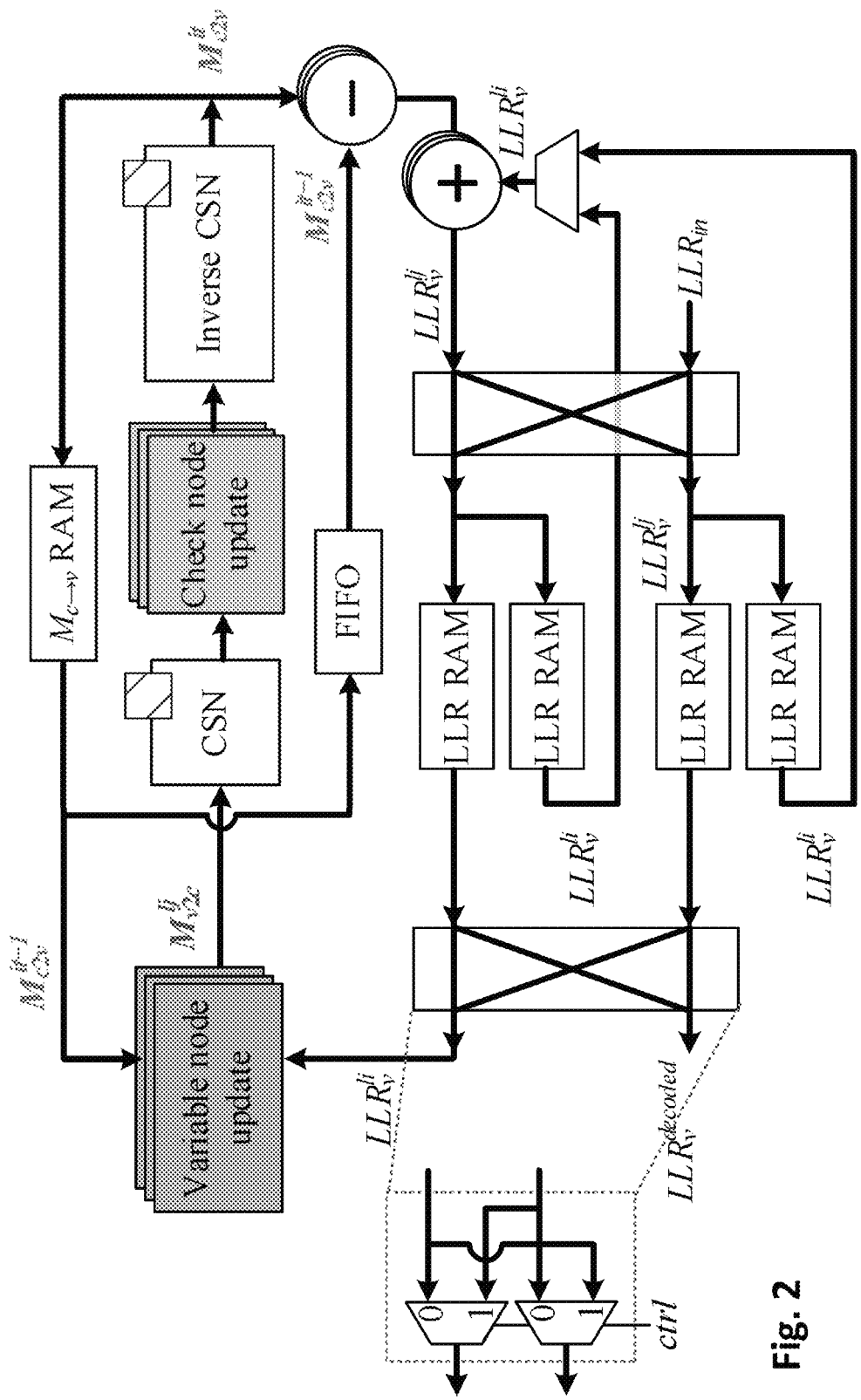
FIG. 2 shows another exemplary decoder architecture that supports LLR updates without postponing the LLR update like in FIG. 1 and further provides for double buffering.

The architecture shown in FIG. 1 solves the stall cycles issue, i.e., the $n_{stall}$ from (12) in Petrović et al. (see section III.A) now equals to 0. However, the $n_{init}$ is still a significant number in all practical applications. For short codewords, i.e., for codes with small circulant size Z, $n_{init}$ is usually not a large number—most frequently, it is equal to n/Z, where n is the codeword length and Z is the circulant size (=lifting size). In such cases, Z LLR values are written to/read from LLR memory in parallel. However, if Z is large user interfaces may not be practical and requires extremely high data bit width for reading the LLRs from the LLR memory. Therefore, one could consider splitting the Z values to several smaller LLR groups of, for example, 8 or 16 LLR values. Consequently, the number of initialization clock cycles is then increased to:

$$n_{init} = \frac{n}{Z} n_{groups} \xrightarrow{\text{interface with 16 LLRs}} \frac{n}{Z} \frac{Z}{16} =$$
$$\frac{n}{16} \xrightarrow{\text{long 5G NR code,BG1,R=1/3,Z=384}} \frac{25344}{16} = 1584,$$

which is a high number. For the given 5G NR example (BG1, code rate 1/3, and Z=384), $n_{init}$ is equal to the number of clock cycles for 5 iterations of decoding. Another example: BG1, code rate 22/25, and Z=384, $n_{init}$ is equal to the number of clock cycles for 8 iterations of decoding. This is a huge overhead and can be avoided if a so-called double buffering is used. This technique assumes that there is one more LLR memory block available and it is used for storage of the next codeword LLR values and previously decoded LLR values (also denoted patch LLR herein below) for use in intrinsic LLR updates of variable nodes for which a pipeline conflict/data hazard is present at the time of update. The decoder architecture that supports double buffering is shown in FIG. 2.

The buffer LLR RAM memories are multiplexed with the decoding LLR RAM. One LLR RAM block is used for decoding of the current codeword, while another LLR RAM block is used for reading the decoded LLR values of previous codeword and for writing new LLR values of the next codeword. When the decoding of the current codeword is finished, the two LLR RAM blocks change their roles: the decoding LLR RAM becomes the buffer LLR RAM, whereas the buffer LLR RAM becomes the decoding LLR RAM since it is already initialized with the next codeword's LLRs. This way, $n_{init}$ is reduced to 0, but the memory resources are doubled again.

Embodiment of this disclosure aims to solve this complexity issue by merging the memory double buffering, and the memory necessary for LLR updates into a single memory block. To do that, embodiments of the disclosure use a so-called hybrid decoding algorithm generally described in section III.A of Petrović et al.

According to embodiments of this disclosure, the decoder architecture ensures that LLRs of the variable nodes v are updated as soon as possible with the preservation of all the check node contributions. There is no wait for the LLR update in case of a memory access hazard occurs. The "outdated" LLRs of a previous layer (i.e the "current" LLRs upon starting the processing the current layer and prior to their intrinsic update in the processing of the current layer) are read in case of a memory access hazard occurs at time instance of the intrinsic updates of LLRs. When the "outdated" LLRs from one of the previous layers are ready, they are written to the LLR memory as in the layered schedule, but they are also buffered in another portion of the LLR memory and used later in the LLR update process of the current layer in case of a data hazard.

In case of there is no pipeline conflict/data hazard, the LLR update process of $LLR^{ij}$ in the decoding process of the current layer/is the conventional intrinsic LLR update expressed in the equation (11) of Petrović et al. reproduced below, $$LLR_v^{ij} = M_{v2c}^{ij} + M_{c2v}^{it}. \qquad (11)$$

i.e. the updated LLR value $LLR_v^{ij}$ for the variable node v is updated by adding the value of the variable-to-check message $M_{v2c}^{ij}$ generated by the variable node v generated when processing of the current layer/and the check-to-variable message $M_{c2v}^{it}$ generated when processing of the current layer j to the variable node in the current iteration it.

In case of a pipeline conflict/data hazard, the LLR update process of $LLR^{ij}$ in the decoding process of the current layer j for "outdated" LLRs $LLR^{li}$ of a previous layer j is done using the contribution $\Delta M_{c2v}$ in line with equation (13) of Petrović et al. which can be rewritten as follows (note that layer indices are updated).

$$LLR_v^{ij} = LLR_v^{li} + M_{c2v}^{it} - M_{c2v}^{it-1} = LLR^{li} + \Delta M_{c2v} \qquad (13')$$

Here, where $\Delta M_{c2v}$ is the contribution of the check node c to the LLR that corresponds to the variable node v and $LLR_v^{li}$ is the "outdated" LLR (or patch LLR) from one of the previous layers.

This way, the LLR updates for the variable node v are as frequent as in the layered schedule, for each processed layer. Nevertheless, the schedule is still not "fully layered", since some LLRs are not always updated with the check node contributions of the previous layer (but are "patched" using the patch LLRs) before their usage in processing of one or a few next layers. Therefore, the decoding schedule outlined above is referred to as a "hybrid decoding schedule". The hardware overhead for support of the hybrid decoding schedule is small and allows for a removal of all stall cycles in the decoding.

Figure 3:
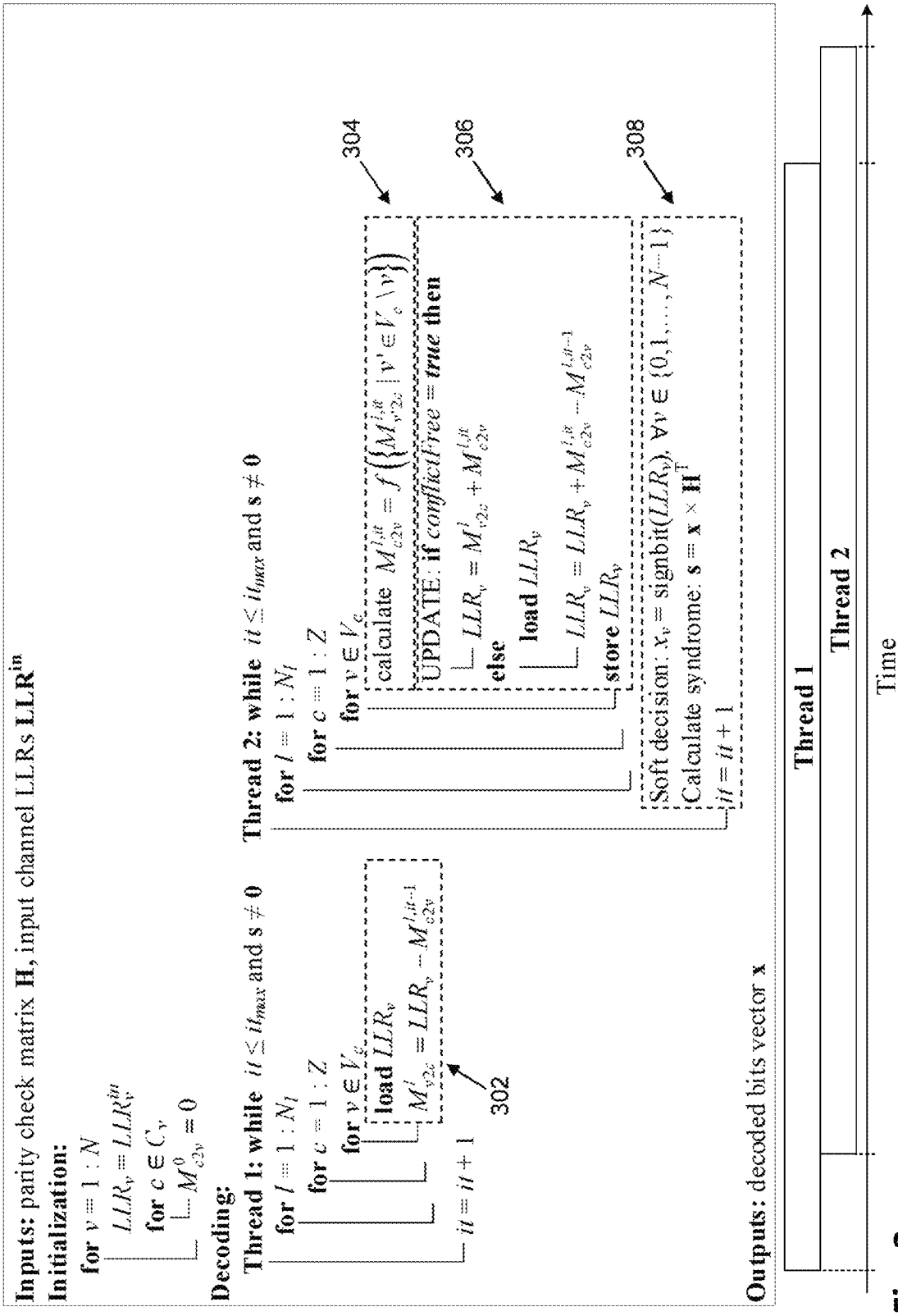
FIG. 3 shows a pseudo-code representing a hybrid decoding schedule of an iterative decoding algorithm as used in some embodiments of the disclosure.

The algorithmic representation of the hybrid decoding schedule in accordance with some embodiments of the disclosure is shown in FIG. 3 (note that the index of the layers in FIG. 3 is l). The algorithm in in FIG. 3 integrates two processes: calculation of variable-to-check messages $M_{v2c}^{l}$ in Thread 1 and calculation of new check-to-variable messages $M_{c2v}^{l,it}$ and LLR update of $LLR_v$ (as per equations (13) and (13')) in Thread 2. Both threads work can work in parallel—e.g. they can be implemented using a plurality of processing elements of the decoder. For example, the loading of the current LLR values for the respective variable nodes and the calculation of the variable-to-check messages $M_{v2c}^{l}$ in Thread 1 that are marked in with the box 302 may be performed by the processing elements that implement the variable node units (VNUs). The calculation of the new check-to-variable messages $M_{c2v}^{l,it}$ in Thread 2, as indicated by block 304, may be executed in the processing elements that implement the check node units (CNUs). The update of the LLR values for the variable nodes in Thread 2 may be performed in the processing elements that implement the LLR update unit.

At the bottom of FIG. 3, Thread 2 is exemplarily shown to be delayed for highlighting the pipeline latency in a hardware decoder implementation. The "conflictFree" variable in the inner for-loop traversing all variable nodes $v \in V_c$ connected to a given check node c in the Tanner graph corresponding to the PCM H. The variable "conflictFree" is true if $LLR_v$ used for calculation in Thread 1 is up-to-date for the LLR update in Thread 2, i.e. no pipeline conflict/data hazard has occurred in accessing the $LLR_v$ for calculation of the variable-to-check messages $M_{v2c}^{l}$ in Thread 1 so that it can be used in the LLR update in Thread 2.

Figure 4:
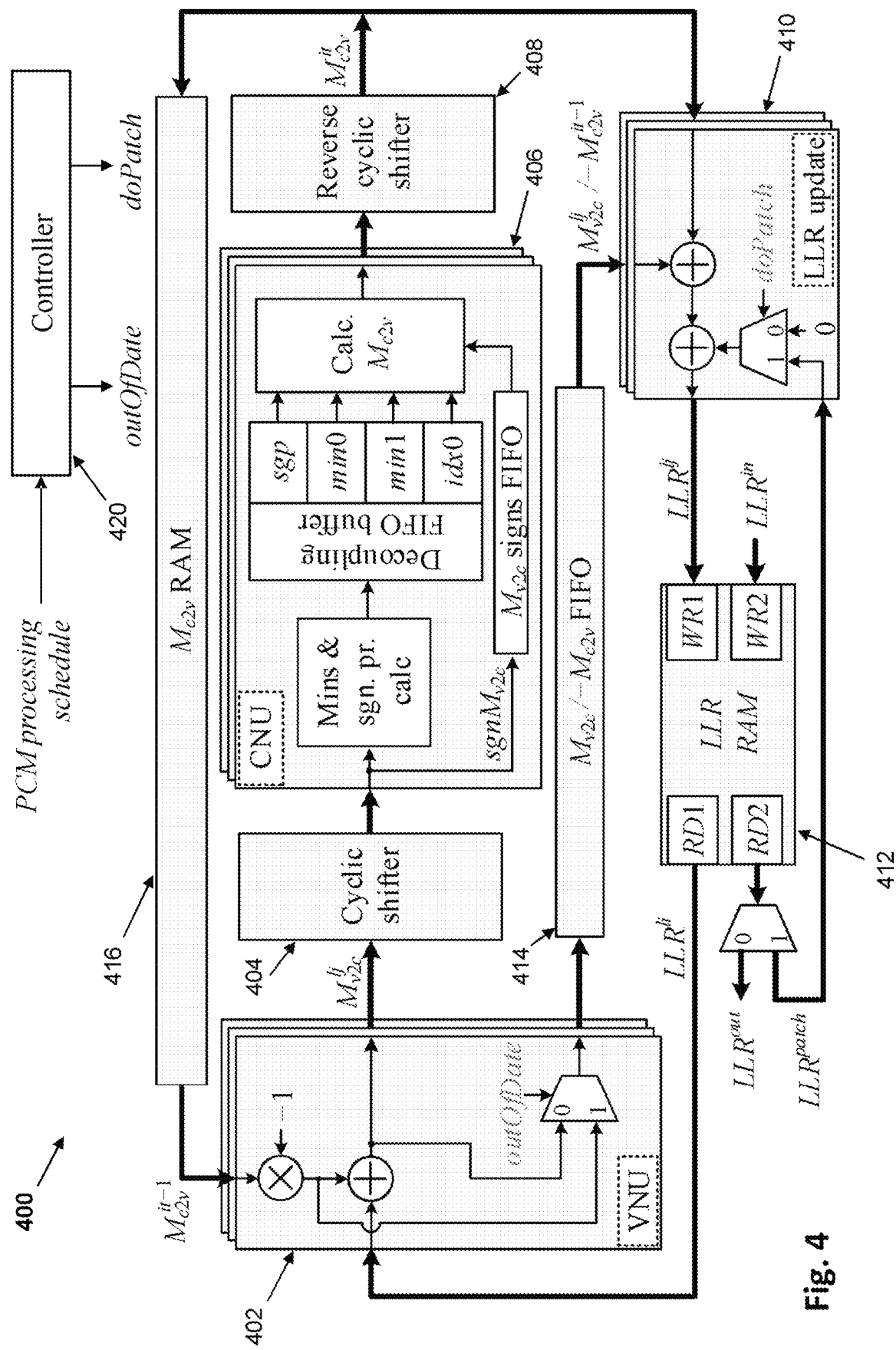
FIG. 4 shows an example decoder core for a QC-LDPC decoder core in accordance with some embodiments of the disclosure which is configured to implement a hybrid decoding schedule.

An exemplary architecture of a LDPC decoder core 400 for decoding a QC-LDPC code according to embodiments of the disclosure is shown in FIG. 4. It is noted that the LDPC decoder 400 is not limited to decoding QC-LDPC code, but may also be used for or modified for decoding other LDPC codes (e.g. by processing the PCM of the LDPC code to become close to quasi cyclic and/or optimizing the processing schedule). Almost all elements are modified compared with the conventional layered architecture using double buffering as shown in FIG. 1. Firstly, the LLR memory (LLR RAM) 412 supports double-buffering. In the example shown in FIG. 4, the LLR memory 412 may be composed of two separate memory blocks 502, 504, e.g. two separate simple dual-port RAM blocks—one block for the decoding of the current codeword (also referred to as a decoding memory) and another block, which is used for the reading of the decoded LLRs of the previous codeword and for the writing of the LLRs of the next codeword (also referred as a buffer memory) and for storing the "outdated" LLRs from processing a previous layer as patch LLRs for the LLR update in the processing of the current layer in case of a pipeline conflict/data hazard. The previous/next codeword and the current codeword may be in separate memory spaces or may be in the same memory space. In some examples, the patch LLRs may be stored in a memory space separate from the previous/next codeword and/or the current codeword, or they may be stored in the same memory space as the previous/next codeword and/or the current codeword. The proposed decoding method supports soft outputs. However, if only hard outputs are needed, the decoded LLRs do not need to stay in the RAM block after the decoding. The described double buffering is necessary to avoid additional latency at the beginning of the decoding, as outlined in subsection II.B of Petrović et al. (it reduces the $n_{init}$ parameter from equation (12) to 0).

The LDPC decoder core 400 further comprises a plurality of variable node units (VNUs) 402 and a plurality of check node units (CNUs) 406 that implement the functionality of the variable nodes and check nodes in the message passing-based iterative hybrid schedule decoding algorithm. The individual VNUs 402 and CNUs 406 may be implemented by individual processing elements of an integrated circuit, e.g. implemented by the (programmable) logic cells of a FPGA fabric or PLD fabric, which perform the functions of the variable nodes and check nodes, as well as the intrinsic LLR updates.

Figure 6A:
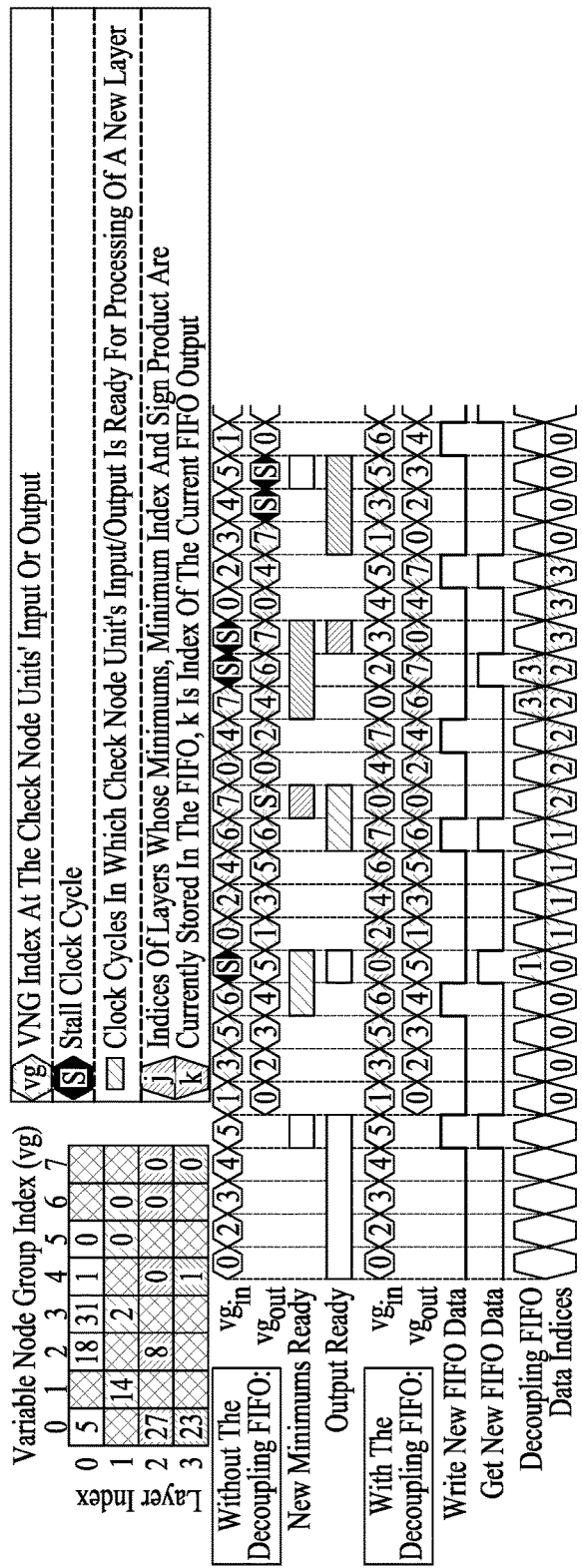
FIG. 6(a) shows the necessity of stall cycles in a decoding process and stall cycles removal for an example irregular QC-LDPC code PCM using a decoupling FIFO buffer in the check node units (CNUs) of a decoder core.

The VNUs 402 are configured to load current LLRs of the current codeword (or a portion thereof) from the one of the two memory blocks 502, 504 of the LLR memory 412 and calculate (in the current iteration it) for each of the variable nodes v and for the currently processed layer j, a variable-to-check message $M_{v2c}^{ij}$ by adding the current LLR $LLR_v^{ij}$ corresponding to the respective variable node v and a check-to-variable message $M_{c2v}^{it-1}$ to the respective variable node v calculated in the previous iteration it−1. The CNUs 406 also receive (in the current iteration it) the variable-to-check messages $M_{v2c}^{ij}$ from the VNUs 402 connected to them via the Tanner graph, and calculate a check-to-variable messages $M_{c2v}^{it}$ of the current iteration it based on variable-to-check messages $M_{v2c}^{lj}$ received from the VNUs 402. This assumes that the layers of the PCM are such that entire rows of PCM are comprised in the layers. The CNUs 406 may perform a min-sum algorithm-based single parity check (SPC) soft input soft output (SISO) decoding to calculate a check-to-variable messages $M_{c2v}^{it}$. For this, each CNU 406 may comprise one or more functional blocks to determine the minimum min0 and subminimum min1 according to the min-sum algorithm and the product of the signs spg of the variable-to-check messages $M_{v2c}^{lj}$ from the VNUs that correspond to the variable nodes connected to the check node that is implemented by the respective CNU, and the index idx0 of the minimum min0. Each of the CNUs 406 contains a register for the $M_{v2c}^{lj}$ sign product (sgp), minimum (min0), subminimum (min1) and the index of the minimum (idx0) that form intermediate data. The CNU's register is used for storage of the intermediate data from the previous layer li while the new layer lj's minimum (min0) and subminimum (min1) are determined. At the same time, the stored intermediate data is used for calculation of new check-to-variable messages for the previous layer li. An example timing diagram of the CNU behavior for an example permutation matrix without and with the decoupling FIFO buffer is shown in FIG. 6(a). The permutation matrix has 4 rows (layers in the PCM) and 8 columns. Each column of the permutation matrix represents a set of Z variable nodes. These sets are usually called variable node groups (VNGs). Each entry in the permutation matrix represents the PCM's identity submatrix shift value or a zero submatrix. If no decoupling FIFO buffer is not used, the processing would need to be stalled whenever new minimums are ready, but the check-to-variable messages for previous layer were not all calculated yet, and whenever there are still no calculated minimums for generation of new check-to-variable messages. If the decoupling FIFO of the CNUs 406 is used, as will be outlined in connection with FIG. 6(b) below, these stall cycles can be removed. For better understanding, FIGS. 6(a) and (b) do not include pipeline conflicts.

The timing diagram of FIG. 6(a) shows that when the CNW of check nodes inside two consecutive layers is different, either minimums calculation or new check-to-variable messages generation must be stalled if no decoupling FIFO buffer is used in the CNUs 406. In the worst case scenario, the processing must be stalled for dc,max-dc,min clock cycles, where dc,max is the maximum CNW and dc,min is the minimum CNW. For example, in 5G NR, dc,max-dc,min is 16 (dc,max is 19 and dc,min is 3), which is a high value. Each change of the CNW produces additional stall cycles.

To remove described stall cycles, CNU's input and output can be decoupled. The natural place for the decoupling is after the calculation of intermediate data. For this purpose, a decoupling FIFO buffer is inserted inside the check nodes (see FIG. 4). The decoupling FIFO buffer prevents overwriting of the intermediate data when layers with the different CNW are processed without stalling. For maximal efficiency the first layer that is going to be processed should be the one with the maximal CNW. The decoupling FIFO depth may depend on the code irregularity. For Wi-Fi, WiMAX or DVB-S2X, the necessary depth is only 2. For more irregular codes the depth needs to be higher, but not higher than $[d_{c,max}/d_{c,min}]$.

Memory access pipeline conflicts can be solved as follows. Whenever a reading of LLRs for the VNG vg is needed, it is checked if that VNG is used previously for another layer calculation and is not yet updated in the decoding memory block of the LLR memory 412. If so, the outdated LLRs are read from the LLR memory 412, but the LLR update for these LLRs will be done differently than in conventional layered architecture. VNUs 402 calculate variable-to-check messages and pass them to the CNUs 406. However, if the outdated LLRs were read (indicated by the outOfDate signal produced by the controller 420 in FIG. 4), VNUs 402 write (negated) "old" check-to-variable messages to the $M_{v2c}/-M_{c2v}$ FIFO buffer 414 instead of the new variable-to-check messages. Those "old" check-to-variable messages are used later for calculation of the contributions $\Delta M_{c2v}$ in the LLR update unit 410 Check-to-variable messages are calculated in a conventional manner.

The LLR update unit 410 in FIG. 4 receives a new check-to-variable message and the data from the $M_{v2c}/-M_{c2v}$ FIFO buffer 414. The LLR update unit 414 may have several sub-units each for updating one of the LLRs corresponding to the different variable nodes. The result of the update is either new intrinsic LLR or a contribution $\Delta M_{c2v}$. In case that the contribution $\Delta M_{c2v}$ is provided to the LLR update unit 410, this contribution $\Delta M_{c2v}$ is added to the latest LLR value of the respective variable node. This latest LLR value is also referred to as a patch LLR ($LLR^{patch}$). The update mechanism used is controlled by the doPatch signal produced by the controller 420 in FIG. 4. Notably, the controller 420 may produce the doPatch signal by delaying the outOfDate signal by a predetermined number of clock cycles that corresponds to the pipeline depth of the decoding path of the decoder core 400 and to the maximum check node weight in the PCM (see also FIG. 6). The outOfDate signal is asserted by the controller 420 every time an outdated LLR has been read from the LLR memory 410.

Figure 5:
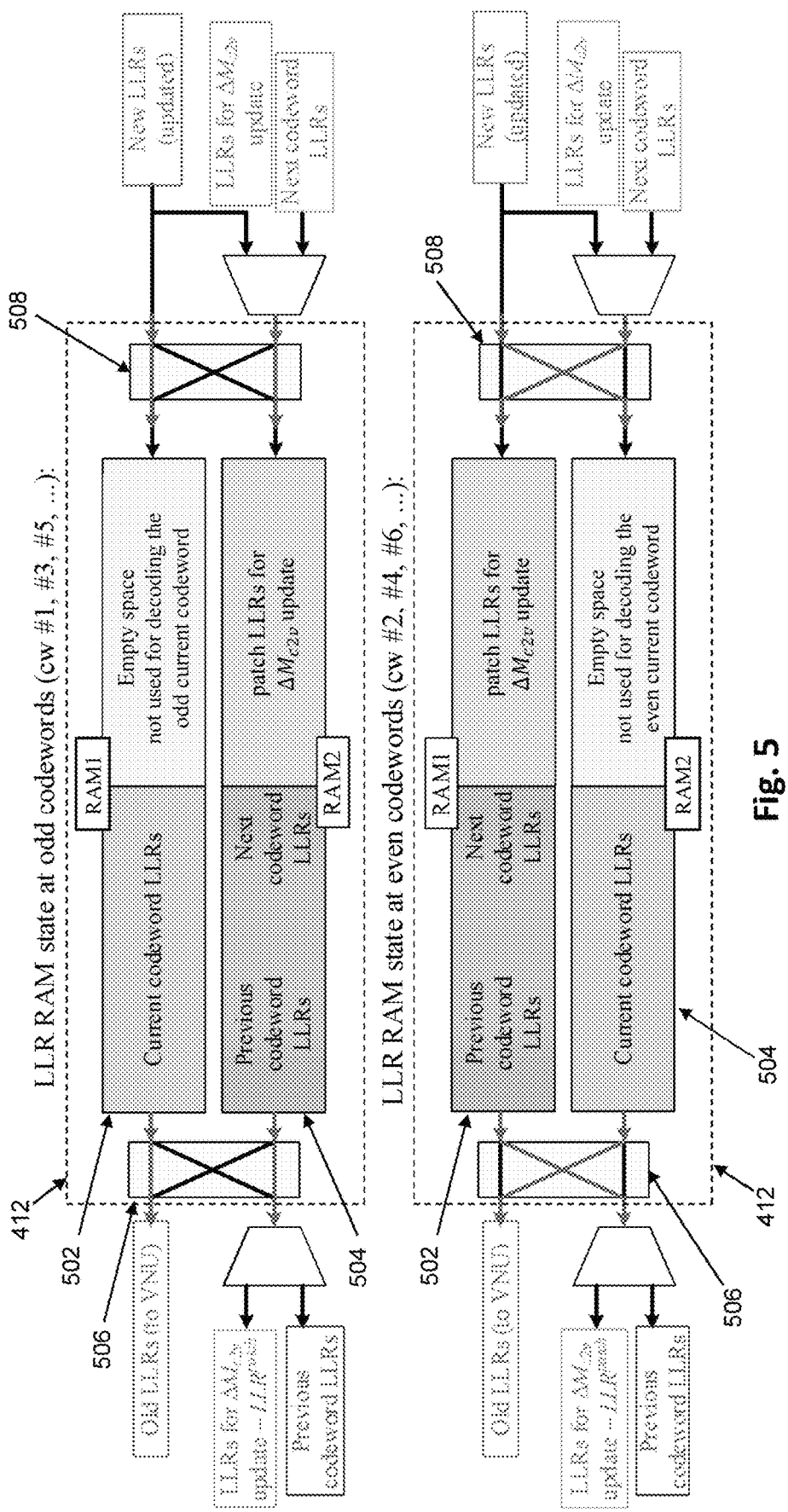
FIG. 5 shows an example LLR memory configuration of the decoder core of FIG. 4 in accordance with some embodiments of the disclosure that supports double buffering and where the two memory blocks switch role depending on whether an odd or even codeword is currently decoded.

The read port of the decoding memory block (memory block 502 in the upper portion of FIG. 5, memory block 504 in the upper portion of FIG. 5) is always busy, so the patch LLR should be read from the buffer memory block (memory block 504 in the upper portion of FIG. 5, memory block 502 in the upper portion of FIG. 5). Note that the pipeline depth through the VNUs 402, the cyclic shifters 404, 408 and CNUs 406 to the LLR update unit 410 may be several clock cycles (e.g. >12 clock cycles), which can cause the pipeline conflicts discussed previously. The pipeline depth for the patch LLRs between a read port of the buffer memory block of the LLR memory 412 and the LLR update unit 410 may be significantly shorter (e.g. only 3 to 5 clock cycles), which allows for pipelining the patch LLRs back to the LLR update unit 410 for "patching" the LLR for a given variable node.

Whenever the LLR write operation to LLR memory occurs, it is checked in the controller 420 based on the PCM processing schedule if updated LLRs, which are going to be written in the processing of the current layer, are already read for calculations in the processing of one of the next layers (i.e. outdated LLR values have been already read from the decoding memory block for those calculations). If so, the LLRs are written to the buffer memory block too as outlined in more detail below (so-called "double write"). Whenever such "double write" happens, the buffer memory block's write port is not available for write operation of the LLRs of the next codeword which may be loaded into the buffer memory block concurrently with decoding the current codeword. However, there are plenty of free cycles for new codeword LLRs write operation to happen. A similar situation is with the reading of the decoded LLRs of the previous codeword.

Figure 6B:
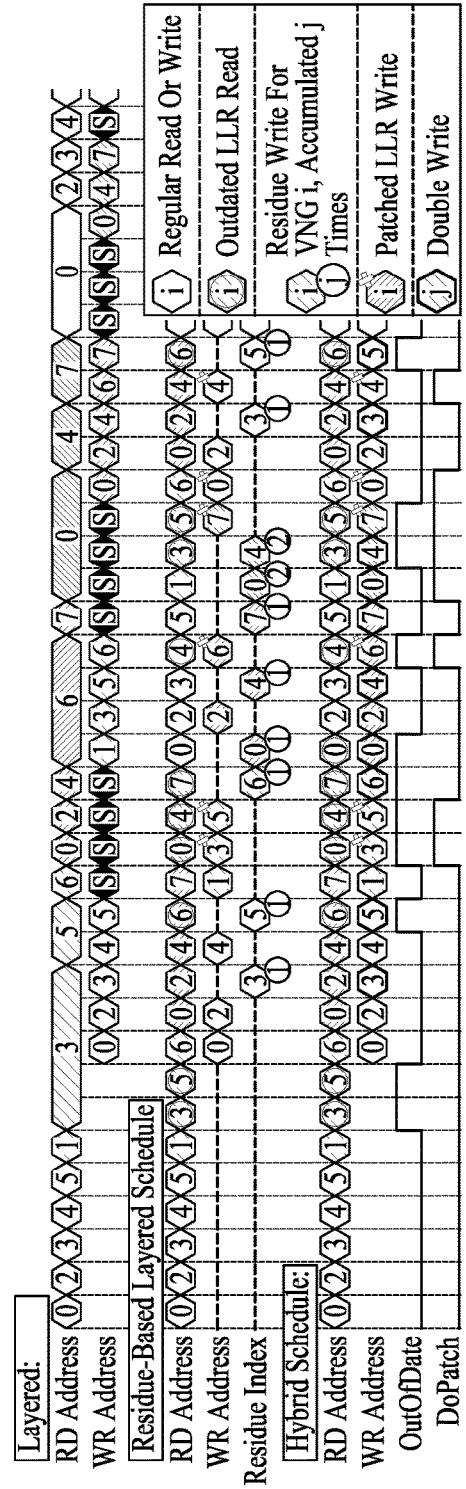
FIG. 6(b) shows necessity of stall cycles in a decoding process when using a layered PCM processing schedule removal for an example irregular QC-LDPC code PCM and stall cycles removal using patching when employing a residue-based layered PCM processing schedule and the hybrid decoding schedule in accordance with some embodiments.

The timing diagram of LLR memory accesses in conventional layered and the proposed hybrid schedule processing discussed above is shown in FIG. 6(b). Additionally, the timing diagram for residue-based schedule approach from Boncalo et al., "Layered LDPC decoders with efficient memory access scheduling and mapping and built-in support for pipeline hazards mitigation," IEEE Transactions on Circuits and Systems I: Regular Papers, vol. 66, no. 4, pp. 1643-1656, April 2019, is shown too, as it is an approach that removes stall cycles too, but postpones LLR updates, as described in subsection III.A of Petrović et al. Please note that "Patched LLR write" in the legend of FIG. 6(b) is a write of a new LLR value that was based on a patch LLR to the decoding memory. The writing of patch LLRs seems is indicated as "Double write" operations in the legend of FIG. 6(b).

The example permutation matrix is the same as in FIG. 6(a) and the number of pipeline stages is three. As shown, the layered architecture requires insertion of many stall cycles, whereas in the residue-based and the hybrid schedule architecture there are no stall cycles at all. The proposed hybrid schedule architecture however provides LLR updates without postponing them and hence may result in a faster convergence than the residue-based architecture of Boncalo et al.

It should be noted that cyclic shifters 404, 408 as shown in FIG. 4, which are optional, may be provided. The cyclic shifters 404, 408 may be used in a decoder structure dedicated for QC-LPDC decoding, where the PCM may be assumed to be based on cyclically shifted identity matrices and optionally zero matrices. When CNUs are implemented as hardware blocks, they cannot change their position during the decoding. Cyclic shifters 404, 408 may thus form a shuffling network to ensure that correct LLR values/messages are routed to the correct CNU 406s. Considering the fact that PCM is based on circulants (i.e. circularly shifted identity matrices), the shuffling may be simplified to programmable cyclic shifting, where the shift value of the shifter is equal to the circulant's identity matrix shift. For this, the cyclic shifter 404 may receive a vector of variable-to-check messages generated in the VNUs 402 and circularly shifts the messages in the vector (instead of LLRs) by the value equal to the corresponding shift of the identity matrix (circulant) in the PCM. The cyclic shifter 408 reverses the shift applied by cyclic shifter 404 in a vector of check-to-variable messages produced in the CNUs 406. Shifting messages instead of LLRs may provide resource savings, since message bit widths may be smaller than LLR bit widths. This may be of importance if flexible cyclic shifters 404, 408 should be designed, such as in WiFi, WiMAX or 5G NR, since their resource utilization may be much higher than the resource utilization of the fixed lifting size cyclic shifter 404, 408. Cyclic shifter 404, 408 may for example be realized by a cyclic shift network implemented in the decoder hardware. A cyclic shifter 404, 408 for DVB-S2X may be designed as a three-stage shifter, where each stage shifts data incrementally by multiples of 45, 8 and 1 respectively. Shifters 404, 408 for WiMAX and 5G NR may be designed as two stage shifters, where the first stage is a pre-rotator and the second is a flexible QC-LDPC shift network (QSN)—see for example Chen et al., "QSN—A simple circular shift network for reconfigurable quasi-cyclic LDPC decoders," IEEE Transactions on Circuits and Systems II: Express Briefs, vol. 57, no. 10, pp. 1549-7747, October 2010, which is incorporated herein by reference.

The input and output interface modules of the decoder core 400 are not shown in FIG. 4. In a real-time system, input LLRs received from the channel are usually streamed using a streaming interface in groups determined by an analog-to-digital converter (ADC), usually much smaller than Z LLRs (e.g. up to eight in Xilinx's RF-SoC platform). That is why the input interface module may be designed to pack input LLRs into groups of Z LLRs and write them to the buffer memory in the LLR memory 410 whenever the entire block of data is ready and when the buffer memory in the LLR memory 410 is available. If an input LLR that belongs to the next group (e.g. codeword) of Z LLRs is received at the input, while waiting for the buffer memory in the LLR memory availability, it is buffered inside the input module. The output interface module unpacks LLRs (or hard outputs) into the convenient bit width. Both input and output interfaces may have streaming handshake control and make the decoder easy to integrate in another system.

FIG. 5 shows the architecture of the proposed LLR memory 410 from FIG. 4. The memory capacity of the individual memory blocks 502, 504 is doubled, but the number of ports is reduced in comparison to the decoder architecture in FIG. 2. Therefore, instead of using 4 equally sized independent memory blocks as shown in FIG. 2, the proposed architecture in FIG. 5 uses only 2 memory blocks 502, 504 but with higher depth. Since in the hybrid decoding algorithm the "outdated" LLR value is needed as a patch LLR value only when a pipeline conflict occurs, the same memory block (RAM block 504 in the upper portion of FIG. 5 and RAM block 502 in the lower portion of FIG. 5) is used for patch LLRs and for buffering the previous decoded codeword and the next codeword. The decoded previous codeword is read from the memory block 502, 504 when the read port is available, i.e., when it is not used for reading patch LLRs, and the next codeword is written into the memory block 502, 504 subsequently when the write port is not used for writing patch LLRs.

FIG. 5 also shows in the upper and lower part the two configurations of the LLR memory 410 for odd and even codewords where the two memory blocks 502, 504 of the LLR memory change their roles by proper routing and/or multiplexing of the inputs and the outputs of the two LLR memory blocks 502, 504. For this, the output ports of the two memory blocks 502 are connected to an output routing block 506 (e.g. a multiplexer circuit, switch matrix, routing matrix, or the like), which selectively routes the output from the two memory blocks 502, 504 either to the VNUs 402 or to the LLR update unit 410. Furthermore, the output of the memory block 502, 504 that takes the role of the buffer memory block in the decoding process of the current codeword can also be routed to an output port of the decoder to read the previous decoded codeword. The input ports of the two memory blocks 502, 504 are connected to an input routing block 508 (e.g. a multiplexer circuit, switch matrix, routing matrix, or the like), which selectively routes the updated LLRs of the LLR update unit 410 to the memory block 502, 504 which is the decoding memory block in the decoding of the current codeword and which selectively routes the patch LLR values ("double write") and LLR values of the next codeword to the memory block 504, 502 which is the buffer memory block in the decoding of the current codeword.

Figure 7:
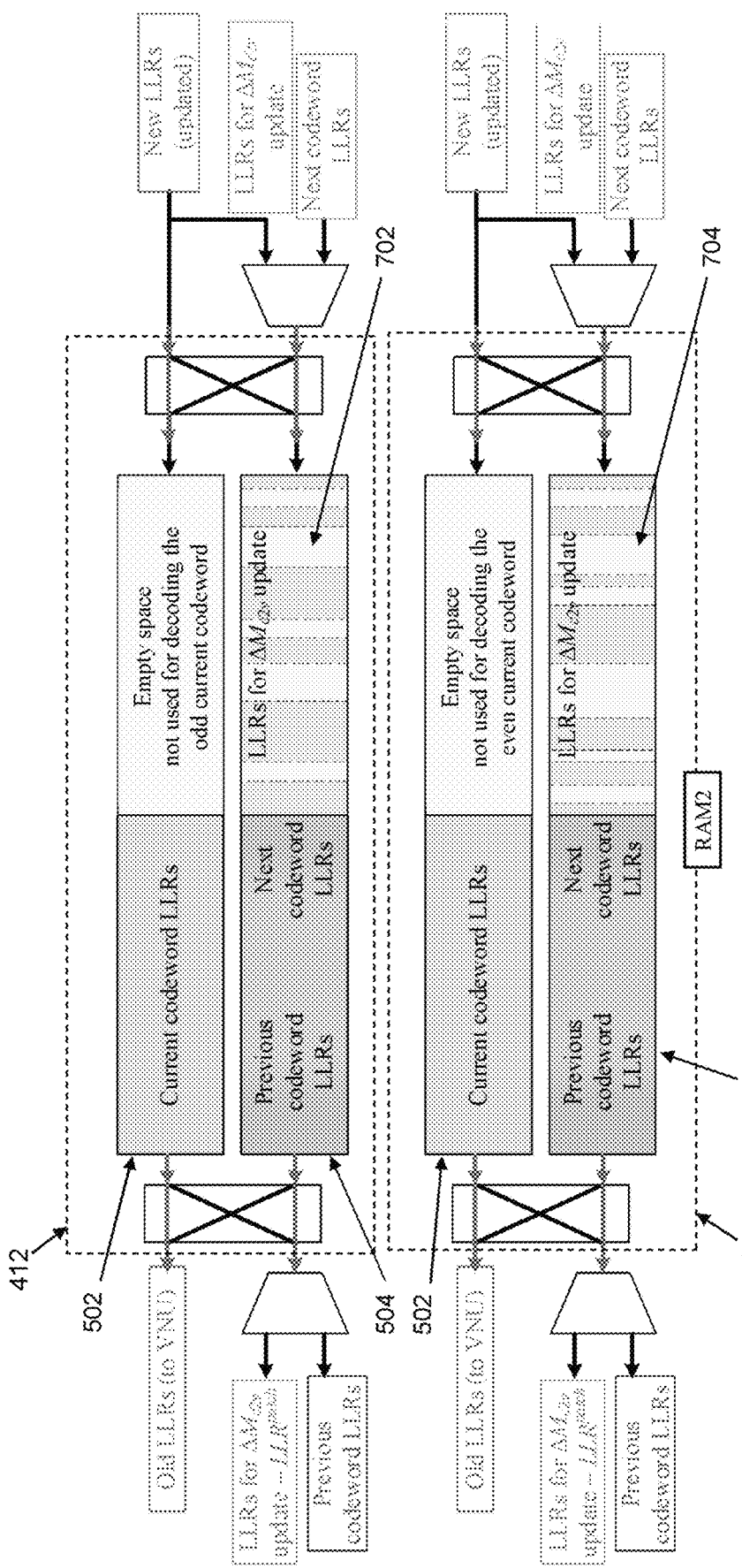
FIG. 7 highlights an example memory utilization (storage of patch LLRs in) a portion of the memory blocks in the LLR memory configuration of in FIG. 5.

The buffer memory block (RAM block 504 in the upper portion of FIG. 5 and RAM block 502 in the lower portion of FIG. 5) that stores the patch LLR values is accessed for reading the patch LLRs when a pipeline conflict needs to be resolved. Consequently, only a part of the buffer memory block (as indicated by reference numeral 702, 704) is filled with patch LLR values needed for the $\Delta M_{c2v}$ patching of LLRs, as illustrated in FIG. 7. Since the addresses of the patch LLRs are changing during a decoding iteration, the positions/addresses of patch LLRs in the buffer memory block are also different at different times of the decoding process of a codeword.

In the LLR memory architecture in FIG. 5 and FIG. 7, the usage of buffer memory may not be optimal. Even though the FPGA resources allow for high memory depth suitable even for long LDPC code applications due to the block RAM (BRAM) granularity in the FPGA, there are use cases where suboptimal usage of memory resources could lead to significant memory overhead in the decoder implementation. In ASIC implementations the memory depths can be custom, but it would be of interest to reduce the necessary depth to as much as possible, to reduce the chip area for the LLR memory in the ASIC.

Another use case where a reduction of the memory size of the LLR memory 410 is desirable is in low power, lower parallelism FPGA implementations of the decoder. In many applications, such as Internet of Things, IoT, the high throughput decoder is not always necessary, but low power and low resources solutions are a priority. In those cases, the decoder can use lower parallelism, i.e., the number of check node units and variable node units would be less than the lifting size Z of the base matrix, and hence the shifter circuits' and other logic blocks' complexity can also be lower. However, irrespective of the parallelism implemented by the decoder, LLRs of the entire codeword or codewords (when using double buffering) must be stored, i.e., the total number of bits for storage in the LLR memory 410 remains the same. However, the memory structure of decoders using lower parallelism may be different than in the memory structure of decoders using high parallelism: The LLR memory 410 may have lower bit width of the read/write ports (i.e. less bits can be read/written simultaneously into the LLR memory) since the number of parallely read/written LLRs is reduced, but the depth LLR memory blocks must hence be higher.

Figure 8:
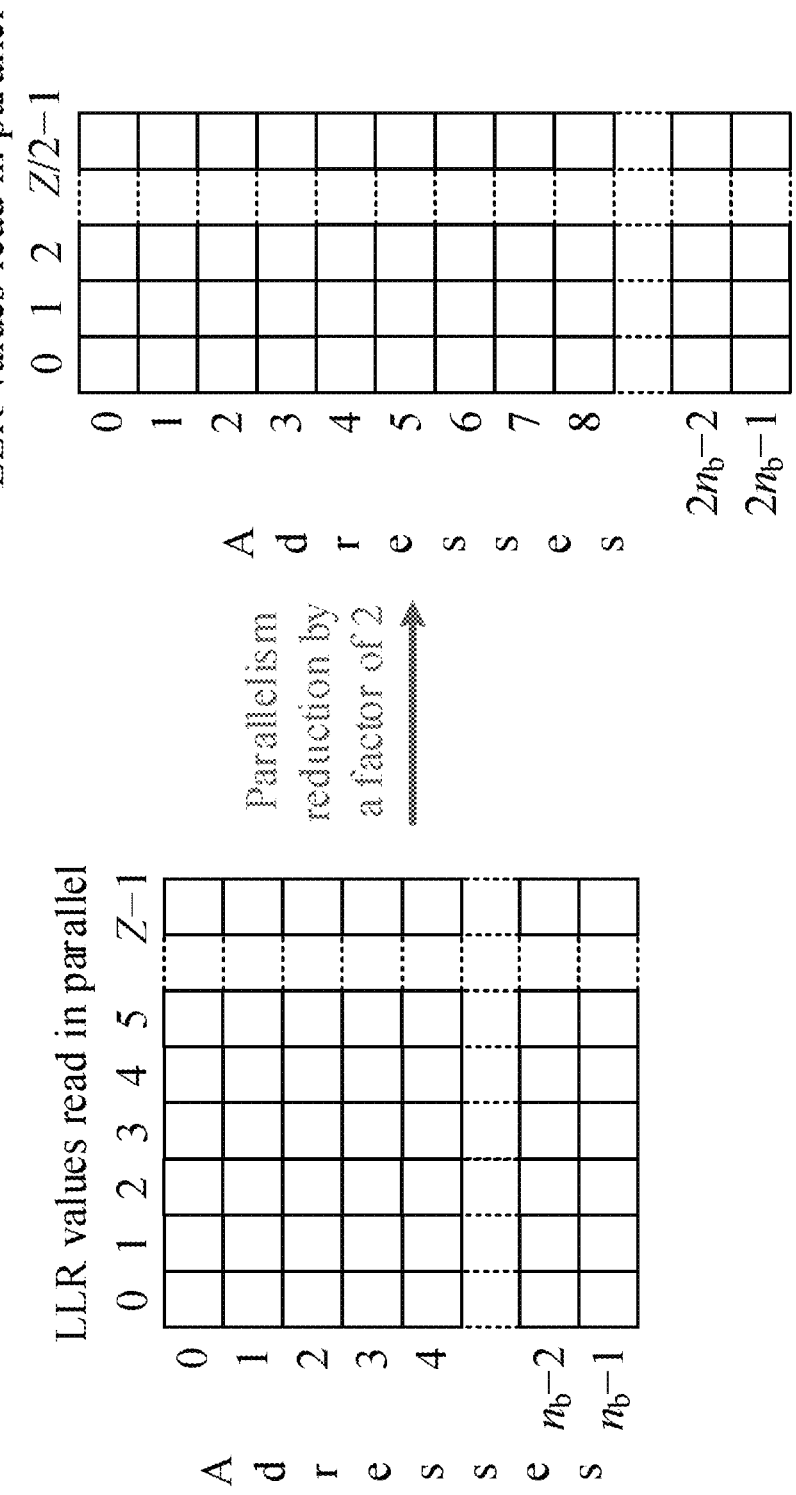
FIG. 8 shows and example memory block configuration where the memory width is Z LLRs so that Z LLRs can be read/written from/to the memory block in parallel versus the case where the memory width is equivalent to Z/2 LLRs so that Z/2 LLRs can be read/written from/to the memory block in parallel.

Some examples of hardware memory resources for specific LDPC codes are shown in Table 1 below. FPGAs usually have blocks of on-chip memory that are optimally packed and may have capacity of a few tens of kbit each. The memory blocks may be configurable to have different (predetermined combinations) of memory width and memory depth. FIG. 8 shows and example memory block configuration where the memory width is Z LLRs so that Z LLRs can be read/written from/to the memory block in parallel versus the case where the memory width is equivalent to Z/2 LLRs so that Z/2 LLRs can be read/written from/to the memory block in parallel (note that each LLR value may have a given bit widths). The codeword length in both example configuration is $n=n_b \cdot Z$. The memory depth in the first case is therefore $n_b$, and in the second case $2n_b$. Note that the reduction of the memory width from Z LLRs to Z/2 LLRs imposes also a reduction of the decoder parallelism, as less bits (equivalent to Z/2 LLRs) can be read in a clock cycle.

Xilinx FPGA families commonly have a memory granularity corresponding to the number of the allocated blocks of memory in the FPGA. A single block of memory (also referred to as block RAM-BRAM) has a fixed size of 36 kbit and can be configured for various data widths and memory depths. Note that other FPGA manufacturers and FPGA families may have a different FPGA memory granularity, which is commonly in the order of 10 kbits to a few multiples of 10 kbit. The data width of the BRAM in Xilinx FPGA families can be, at maximum, 72 bits with a data depth of 512 bits (W: 72 bits, D: 512 bits). Other available BRAM configurations are: (W: 36 bits, D: 1,024 bits), (W: 18 bits, D: 2048 bits), (W: 9 bits, D: 4,096 bits), (W: 4 bits, D: 8,192 bits), (W: 2 bits, D: 16,384 bits), (W: 1 bits, D: 32,768 bits). Utilizing for example a BRAM configuration of (W: 72 bits, D: 512 bits), and if the depth of 512 bits is enough for storage of two codewords (memory space is doubled due to the memory required for the patch LLRs in), the minimum number of block RAMs $N_{BRAM}$ necessary for reading Z LLRs in parallel would be: $N_{BRAM} = \lceil Z \cdot bw_{LLR}/72 \rceil$ where $bw_{LLR}$ is LLR bit width (i.e. number of bits per LLR value, e.g. 8 bits for a LLR value) and $\lceil \: \rceil$ denotes the ceiling operation. Similar calculations can be made using the general equation $N_{BRAM} = \lceil Z \cdot bw_{LLR}/bw_{BRAM} \rceil$ where $bw_{BRAM}$ is the bit width of the BRAM configuration. Considering double buffering for preloading the next codeword and patch LLRs, the total number of block RAMS is twice as high.

Specific BRAM configuration examples of for two example codes and the number of required BRAMs for the different BRAM configuration example are shown in the Table 1 below, noting that the number of BRAMs required for a given configuration is indicated for one of the two LLR memory blocks 502, 504 (please also see the legend below the table). As long as the depth of 512 bits is enough for the LLRs of two codewords, the BRAM utilization approximately linearly scales with the decoder parallelism. However, when the necessary depth passes the threshold, the BRAM utilization remains the same even though the parallelism is reduced. This happens due to the limited BRAM granularity.

For example, consider a 5G NR BG1 code at rate R=22/66, a codeword has $bw_{code}=26,112$ bits. The first row for this code assumes a LLR RAM width of 384 LLRs. The LLR RAM depth for the LLRs for a codeword at size $bw_{code}$ would be $\lceil bw_{code}/LLR\ RAM\ width \rceil = 26,112/384 = 68$, which needs to be doubled (=136) due for buffering patch LLRs for all variable nodes. Using a (W: 72 bits, D: 512 bits) configuration of BRAMs, and assuming 8 bits per LLR value, this means that $N_{BRAM} = \lceil 384 \cdot 8/72 \rceil = 43$ BRAMs of the FPGA are needed for reading bandwidth of the read/write interface. The LLR RAM depth must be large enough to accommodate the 136 LLRs (note that the 8 bits per LLR value are stored in the "width direction" of the BRAM). Using a (W: 72 bits, D: 512 bits) configuration of BRAMs, all 136 LLRs fit into the 512 positions available. Hence, a total of 43 BRAMs is required to store all LLR values and the same number of patch LLR values. The same considerations apply for LLR RAM width of 192 LLRs, which means that the parallelism is reduced by a factor of 2, yielding also a lower number of $\lceil 192 \cdot 8/72 \rceil = 22$ BRAMs. The 512 positions available in the "depth direction" of a (W: 72 bits, D: 512 bits) configuration of BRAMs still suffices to store 136×2=272 LLRs, so that a total of 22 BRAMs can store all LLR values and the same number of patch LLR values.

Considering a further reduction of the parallelism using a LLR RAM width of 96 LLRs, the required number of BRAMs for this width would only be $\lceil 96 \cdot 8/72 \rceil = 11$ BRAMs when using a (W: 72 bits, D: 512 bits) configuration of BRAMs. The LLR RAM depth would be 272×2=544 in this case for a 5G NR BG1 code at rate R=22/66. Hence, when using a (W: 72 bits, D: 512 bits) configuration of BRAMs there are still 22 BRAMs required, as the 544 LLRs cannot be fit into a depth of 512 bits of the BRAMs in the "width direction", so that another 11 BRAMs would be required yielding a total size of 22 BRAMs becoming necessary to store all LLR values and the same number of patch LLR values.

Therefore, it would be of high significance to use lower memory depth for patch LLRs in both ASIC and FPGA realizations when reducing the parallelism of the decoder. Embodiments of the disclosure relate to "squeezing" the storage capacity to hold only the required patch LLRs in FIG. 7, so that the necessary LLR memory depth can be reduced. Specifically, when considering FPGA- and PLD-based implementations of the decoder, number of patch LLRs that need to be stored concurrently in the buffer memory block 502, 504 is reduced so as to fit into the remaining storage locations defined by the width of the selected BRAM configuration. For example, considering the example in Table 1 below for a (W: 72 bits, D: 512 bits) configuration of BRAMs and assuming LLR RAM width of 96 for a 5G NR BG1 code at rate R=22/66 (using double buffering for preloading the next codeword), the buffer memory block requires 272 storage locations for the next codeword. Hence, there remain 512−272=240 storage locations not required for storing the next codeword. If the PCM of the code or an optimized version thereof/optimized PCM processing schedule ensures that no more than 240 patch LLR values need to be held concurrently in the buffer memory block for LLR updates in case of pipeline conflicts, the number of BRAMs that need to be allocated to each of the memory blocks of the LLR memory 410 can be reduced from 22 BRAM to 11 BRAMs, as shown in the second line in Table 1 marked with ♣.

LLRs of one codeword and a second portion 902-1, 904-2 to hold the patch LLR values. Note that memory blocks 902, 904 are equivalent to memory blocks 502, 504 in FIG. 5 and differ therefrom only in their storage capacity. The storage capacity of the second portion 902-2, 904-2 is smaller than that of the first portion 902-1, 904-1 of the memory block 902, 904. The number of patch LLR values and thus the memory block depth of the memory blocks 902, 904 of the LLR memory 410 may therefore be reduced in comparison, e.g. to the decoder implementation in FIG. 2 or FIG. 5, where additional capacity for patch LLRs equivalent to a full codeword is provided in the LLR memory 410.

Figure 9:
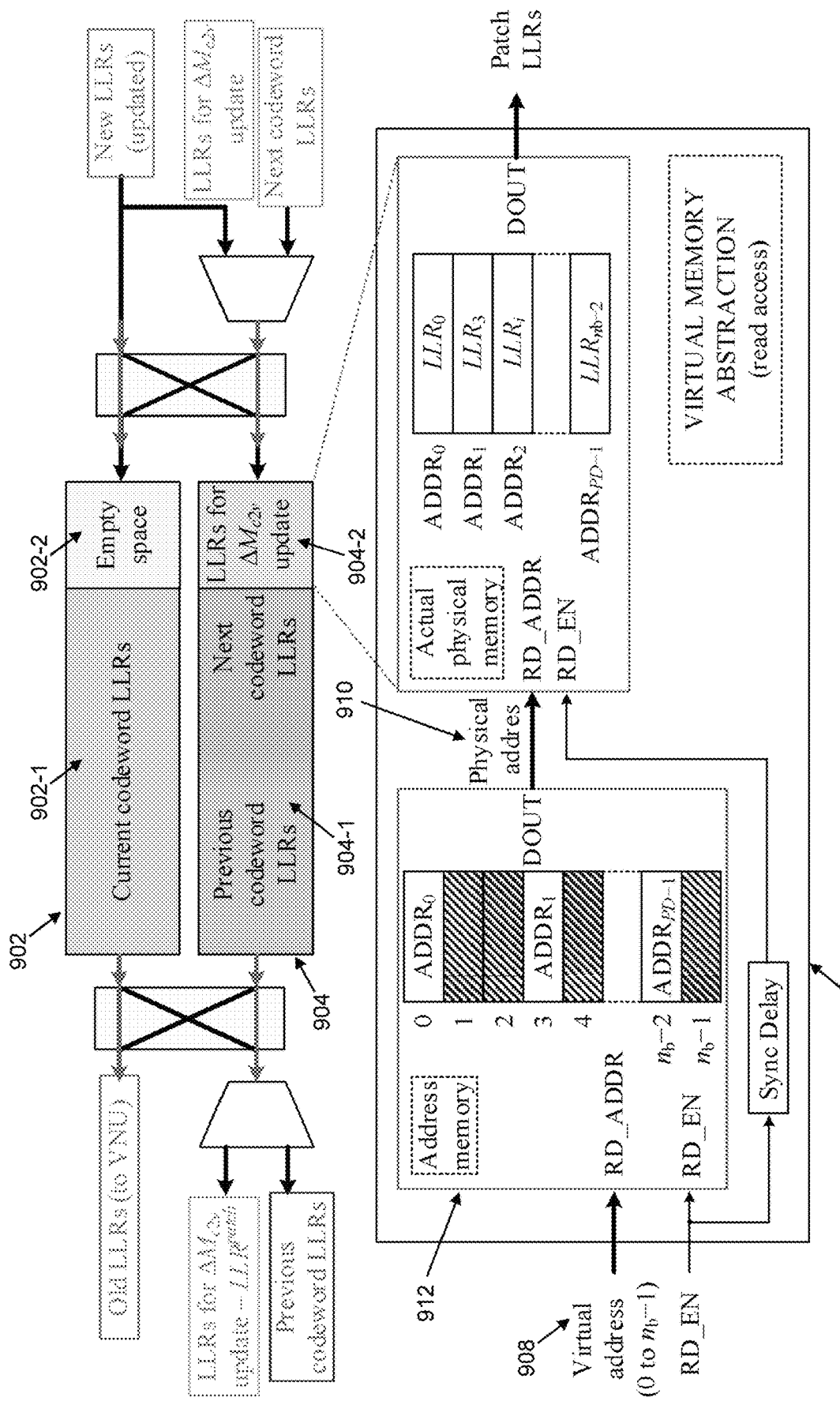
FIG. 9 shows an improved example LLR memory configuration of the decoder core of FIG. 4 in accordance with some embodiments of the disclosure that supports double buffering and where the capacity of a portion of the memory blocks for storage of the patch LLRs is reduced, and further a virtual memory abstraction of the portion of the memory blocks for accessing the patch LLRs using virtual addresses.

Another aspect that is relevant in connection with reducing the LLR memory depth may be the addressing of the patch LLR values in the memory blocks 902, 904. In some embodiments, a virtual memory approach is used for addressing the patch LLRs in the physical buffer memory block 904 or the second portion 904-2 thereof. An embodiment of a virtual memory approach for addressing the portion of the LLR memory blocks 902, 904 storing the patch LLRs for the hybrid decoder application is also shown in FIG. 9. This virtual memory approach provides the controller 420 of the decoder 400 with an abstraction of that memory portion of the memory blocks 902, 904 storing the patch LLR values (see FIG. 9), which is the same as when the patch memory is of the original size.

TABLE 1

| CODE | Codeword length | LLR RAM width (in LLRs) | LLR RAM depth for patch LLR + decoding memory blocks (in LLRs) | Number of Xilinx BRAMs ♦ | BRAM configuration (D × W) |
|---|---|---|---|---|---|
| 5G NR BG1 | 26112 | 384 | 68 × 2 = 136 | 43 | 512 × 72 bits |
| R = 22/66 | | 192 | 136 × 2 = 272 | 22 | 512 × 72 bits |
| | | 96 | 272 × 2 = 544 | 22 | 1024 × 36 bits |
| | | | <512♣ | 11 | 512 × 72 bits |
| DVB-S2(x) | 64800 | 360 | 180 × 2 = 360 | 40 | 512 × 72 bits |
| normal frames | | 180 | 360 × 2 = 720 | 40 | 1024 × 36 bits |
| | | | <512♣ | 20 | 512 × 72 bits |
| | | 90 | 720 × 2 = 1440 | 40 | 2048 × 18 bits |
| | | | <1024♣ | 20 | 1024 × 36 bits |

♣: upper bound for LLR RAM depth for achieving reduction in BRAM utilization;
♦: assuming the LLR bit width is 8 bits; bold values show the buffer optimization benefit.

Similarly, for DVB-S2(x) and using normal frames, adaptation of the BRAM configuration and limitation of the number of patch LLR values that need to be concurrently stored in the memory block allows for reductions of the number of BRAMs utilized for LLR memory 410 in the decoder 400. For example, assuming a LLR RAM width of 180 LLRs, the LLR RAM depth to store a single codeword and patch LLRs for all variable nodes is 360×2=720. The natural choice of a BRAM configuration to accommodate the 720 storage locations would thus be (W: 36 bits, D: 1024 bits). However, when using (W: 72 bits, D: 512 bits) and limiting the number of concurrently stored patch LLR values to 512−360=152, the memory capacity can be reduced by a factor of 2.

Hence, in accordance with embodiments of this disclosure, the required memory capacity for storing the patch LLRs is significantly reduced by determining and/or optimizing the number of patch LLR required to resolve pipeline conflicts in the decoder implementation. This is exemplarily shown on top of FIG. 9, where each of the two memory blocks 902, 904 has a first portion 902-1, 904-1 to hold the For a FPGA implementation, the patch LLRs are stored in the BRAMs as before, but are squeezed to a smaller physical memory space with depth of PD. FIG. 9 shows the example of the address mapping process for reading from and writing to the portion of the memory blocks 902, 904 of the LLR memory 410 holding the patch LLR values. A memory access controller 906 of the decoder 400 receives a target virtual address 908 in a virtual address space that allows addressing a number of storage locations equal to the number of virtual nodes (i.e. equal to the number of bits of the codeword $n_b$). The memory access controller 906 maps the target virtual address 908 received at its input port RD_ADDR to a physical address 910 in the portion 902-2, 904-2 of the respective buffer memory block 902, 904 dedicated to store the PD patch LLR values. For example, if an LLR update should be performed for the LLR value at virtual target address 3, the virtual memory controller 906 maps the virtual target address 3 to the physical target address ADDR1 and read/writes the patch LLR data from/to the address ADDR1. When reading a patch LLR from the memory portion 902-2, 904-2, the virtual memory controller 906 first reads the appropriate target physical memory address 910 matching the target virtual address 908 from an address memory 912 and then uses that target physical memory address 910 for reading from the data from the physical memory (i.e. memory portion 902-2 or 904-2). LLRs in physical memory do not need to be placed in any regular order. Whenever the patch LLR of a currently processed VNG is read from the buffer memory block, the storage location corresponding to the physical address of the read patch LLR can be (re-)used for storage of another LLR value for another VNG, so that storage locations can be reused while processing the layers of the PCM in the decoding process.

The value PD represents the depth of the portion 902-2, 904-2 in a memory block 902, 904 for storing the patch LLRs, i.e. the number of storage locations for buffering patch LLR values in the memory blocks 902, 904 of the LLR memory 410. PD may be determined based on the pipeline depth through the decoding path of the decoder. For example, PD can become at maximum $PD_{max}=n_{PS}+CNW_{max}$, where $n_{PS}$ is the number of pipeline stages (in the path from the output ports of the LLR memory through the VNUs 402, the cyclic shifters 404, 408, CNUs 406, back to the input ports of the LLR memory 410) and $CNW_{max}$ is the maximum check-node weight (which is equal to the maximum number of circulants of the base matrix that are being processed in the pipeline). The value of $PD_{max}$ can be considered equivalent to the number of clock cycles from reading an LLR from a memory address Ax in the decoding memory block to writing the updated LLR to the same memory address Ax in the decoding memory block. This number can still be high for long code words, especially at high code rates. For example, assuming that the decoder has 13 pipeline stages, if DVB-S2 codes are used, $PD_{max}=13+61=74$. As apparent from Table 1 above, this number is smaller than the LLR RAM depth of the codeword required for the different LLR RAM widths in Table 1, which yields that the required patch LLRs can be "squeezed" into the remaining storage locations of BRAMs when limiting the maximum number of storage locations in the LLR RAM depth to thereby reduce the number of required BRAMs.

As noted above, the order/schedule of processing the layers of the PCM may be optimized to yield an optimized PCM processing schedule. The optimized PCM processing schedule may be stored in or is accessible by the controller 420 to control the operation of the decoder code 400. Such optimization may be based on a genetic algorithm (GA). The optimized PCM processing schedule may yield a minimum number of variable-to-check messages from variable nodes calculated in processing all layers that are not based on the most recent LLR associated with said variable node, since outdated LLR values were read from LLR memory for use in calculating the variable-to-check messages. Note that the processing of all layers of the PCM may be considered one iteration of the decoding process. The optimized PCM processing schedule may also yield a minimum number of patch LLRs that need to be stored for processing all layers in decoding the current codeword. These stored patch LLRs may be the patch LLRs concurrently stored in the buffer memory block 902, 904. The PCM processing schedule may be such that the patch LLRs are required at different time instances of the processing of all layers of the PCM in decoding the current codeword, so that some patch LLR may be overwritten with another patch LLR to further save storage locations in the LLR memory blocks. Hence, in some embodiments of the disclosure the PCM processing schedule of the decoder 400 is optimized to yield the minimum number of patch LLR values that need to be stored concurrently in the LLR memory 410 to resolve pipeline conflicts in updating the LLRs of the current codeword.

As outlined in section IV.A of Petrović et al., optimization of the processing order of the circulants representing the PCM in the decoder 400 can affect the number of pipeline conflicts and number of LLR RAM accesses related to the patch LLRs significantly. A lower number of pipeline conflicts may also imply the possibility to reduce the memory depth for the memory (portion) holding the patch LLR values. However, the minimum number of patch LLR accesses does not guarantee the minimum memory depth of the memory (portion) holding the patch LLR values.

Therefore, in a further aspect of this disclosure and in accordance with some embodiments, the optimization of the PCM processing order (or circulant processing order if the PCM can be represented by circulants) may include a memory depth constraint to obtain the optimal memory depth. In some embodiments, a generic algorithm can be used for optimization of the PCM processing order (or circulant processing order if the PCM can be represented by circulants), but the fitness function of the generic algorithm is improved as follows: The fitness function includes two optimization criteria, which are the number of reads of outdated LLRs (imposing patch LLR accesses for the LLR update) and the patch memory depth.

The processing schedule for the hybrid decoding algorithm proposed in this disclosure may degrade the SNR performance when the switch from layered to the flooding schedule is frequent. This may for example happen in cases when the permutation matrix representing the PCM is dense and when the number of pipeline stages in the decoding path of the decoder is high. High clock frequency of the decoder can commonly only be achieved with a high number of pipeline stages, so the SNR performance loss is inevitable for (QC-)LDPC codes with a dense permutation matrix.

One way to avoid performance loss is adding extra iterations. Additional iterations can drastically reduce throughput, but if aggressive pipelining provides a high increase in the clock frequency, there may be enough time margin to add extra iterations and still obtain significant throughput enhancement. However, adding additional iterations is not necessary if the number of read operations that read "outdated" LLRs is reduced using offline PCM optimization (e.g. reordering). The following shows an example embodiment of a method for achieving optimal reordering of the PCM based on the genetic algorithm (GA), which can be used as an enhancement of the hybrid schedule decoding. Since the LDPC codes to be decoded may be known in advance, also their PCM is known and the schedule of processing the different layers of the PCM can therefore be optimized in advance. The optimized processing schedule may thus be stored in a (non-volatile) memory of the decoder 400, and the decoder's controller 420 may apply the optimized PCM processing schedule (or circulant processing order) responsive to the used LDPC code in the hybrid schedule decoding process of a sequence of codewords.

Figure 10:
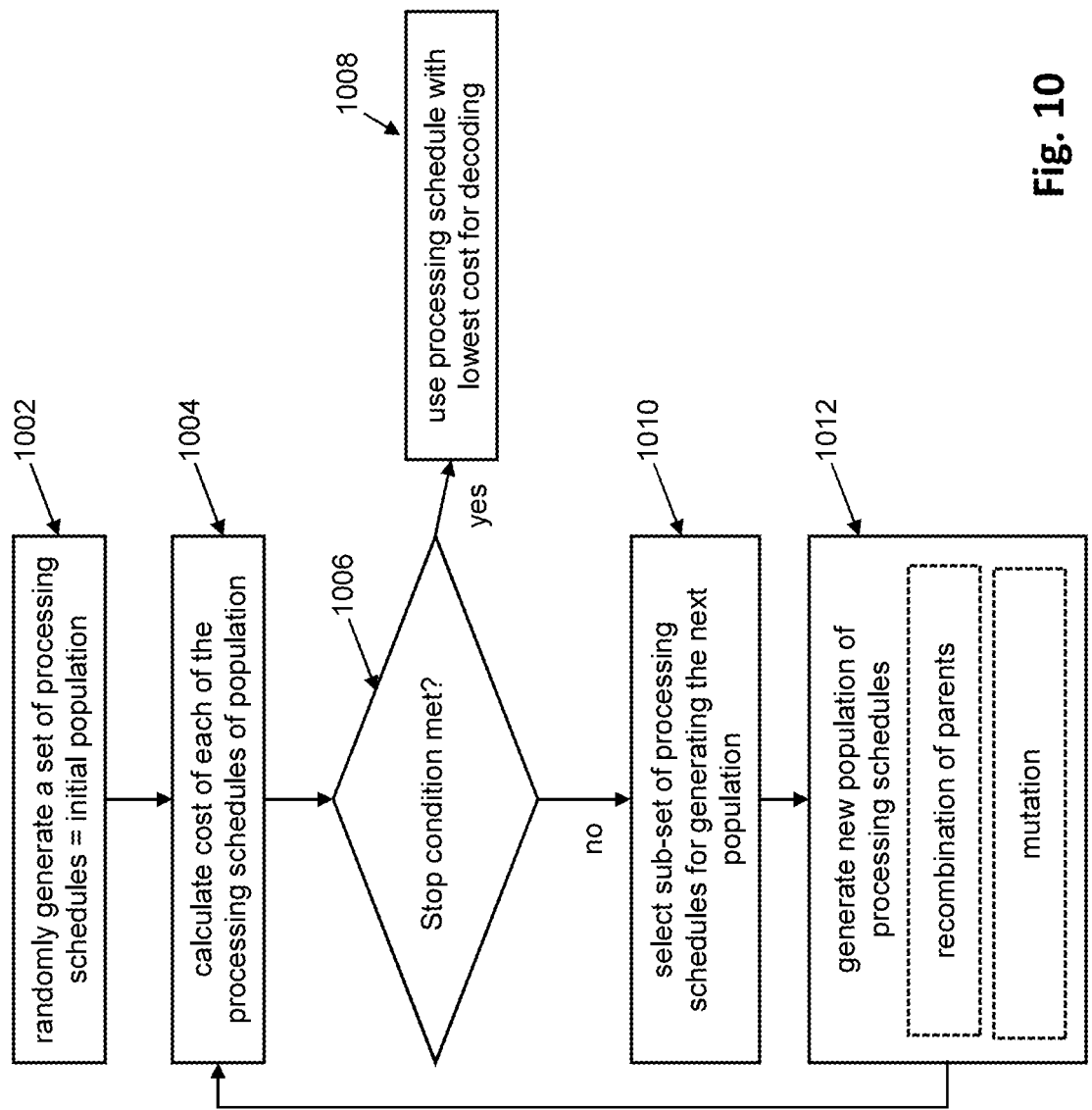
FIG. 10 shows an example method of optimizing the PCM processing schedule based on an genetic algorithm according to an embodiment of the disclosure.
Figure 11:
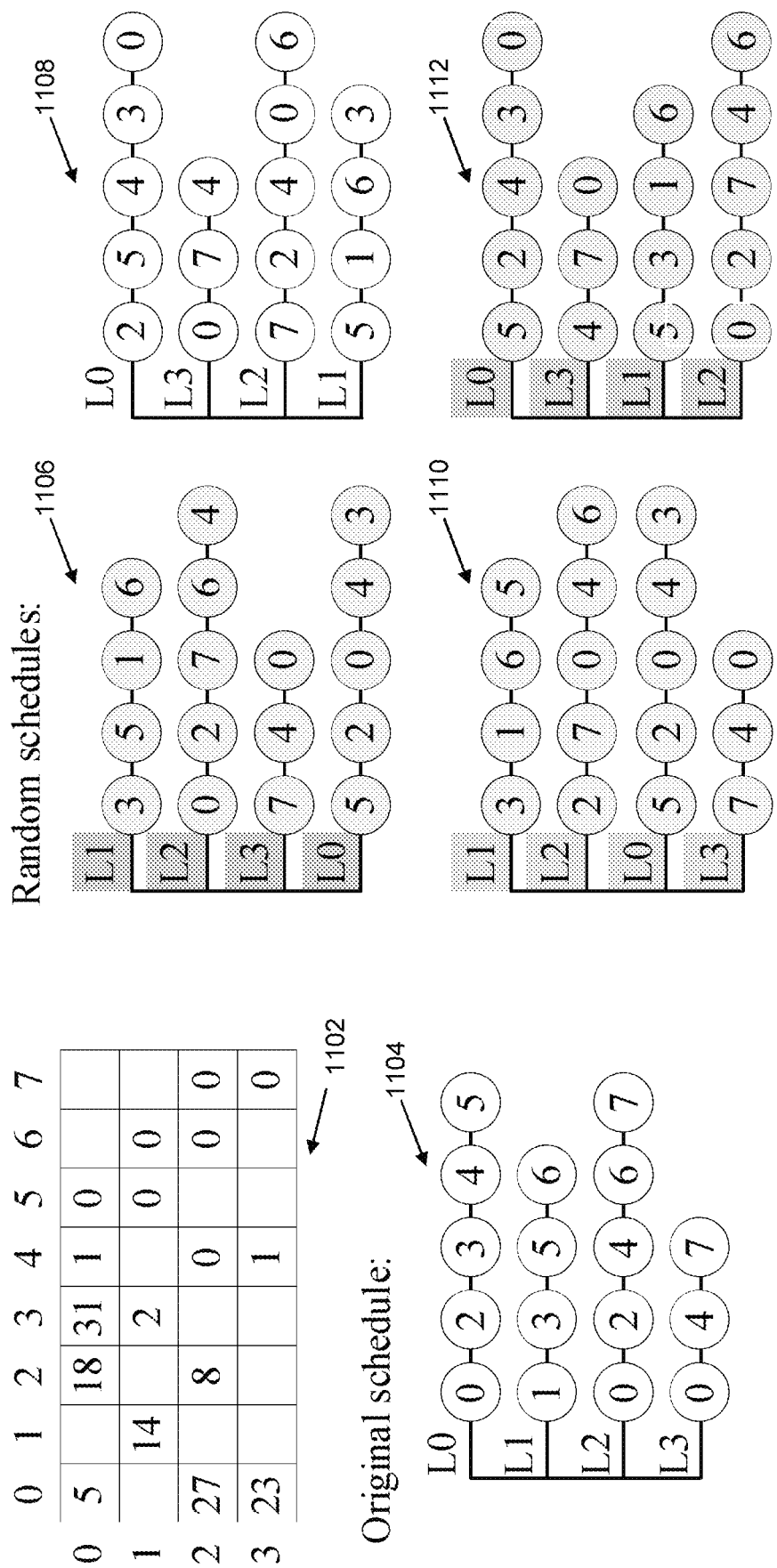
FIG. 11 shows an example permutation matrix equivalent to a PCM of a LDPC code, an original processing schedule as indicated by the permutation matrix and example random permutations of the original processing schedule in accordance with an embodiment of the disclosure.
Figure 12:
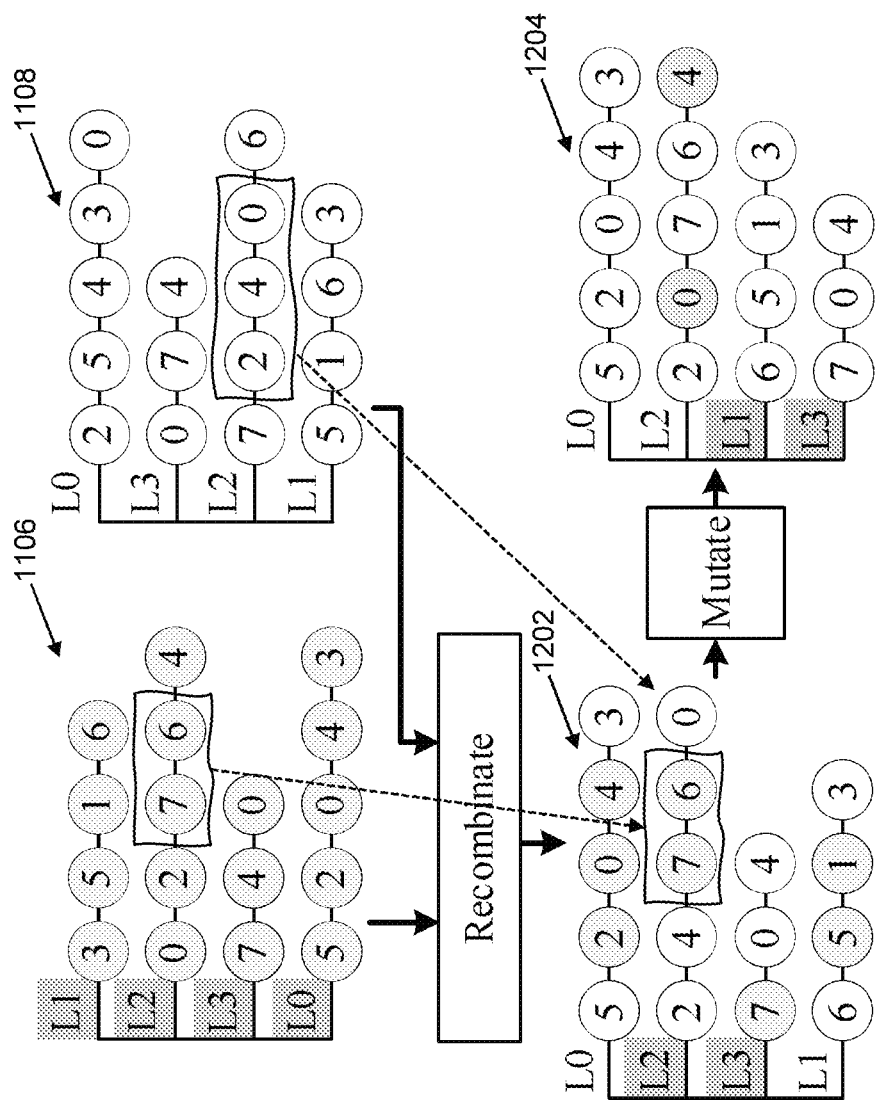
FIG. 12 shows an example of the recombination and the mutation of schedules during the genetic algorithm optimization of the PCM processing schedule in FIG. 10 in accordance with some embodiments of the disclosure.

Layers as well as the VNGs inside a single layer can be processed in any order. One constraint as to the PCM processing schedule may be that layers should be rotated circularly in such a way that the first layer is the one with the maximal check node weight. The processing schedule can be represented as an array of $N_l$ vectors. Each vector represents a single layer. The vectors' entries may be the VNG indices, which are effectively (physical or virtual) addresses of corresponding LLRs of the current codeword in the LLR memory. FIGS. 10 to 12 illustrates the optimization of an example PCM processing schedule in accordance with an embodiment of this disclosure. The PCM can be represented by a permutation matrix that is illustrated on the top left side of FIG. 11. An example graphical representation of the original processing schedule 1104 for the original permutation matrix 1102 is shown on the bottom left side of FIG. 11. Since layers and VNGs inside the individual layers can be processed in any order, it is possible to find a processing schedule that would give the minimal number of "outdated" LLR read operations and hence the best SNR performance of the decoder.

A random schedule can have any permutation of layer indices of the original processing schedule 1104 and any permutation of VNG indices inside any layer. Finding the optimal schedule belongs to the traveling salesman problem class, which is convenient for optimization using a genetic algorithm (GA)—see Larranaga et al., "Genetic algorithms for the travelling salesman problem: A review of representations and operators," Artificial Intelligence Review, vol. 13, no. 2, pp. 129-170, 1999, incorporated herein by reference. The genetic algorithm can provide for the layer reordering inside the original permutation matrix 1102 to obtain a processing schedule of the PCM (that corresponds to the original permutation matrix 1102) that has a minimal number of stall cycles in a layered LDPC decoder 400. In the hybrid schedule decoding as discussed herein, layer reordering only may not lead to a significant reduction of the number of "outdated" LLR read operations. This may be especially true if the number of pipeline stages in the decoding path is high. Embodiment of the disclosure therefore suggested improvements of the GA recombination and mutation processes to include the ordering of VNG processing inside a single layer.

The genetic algorithm approach in optimizing the PCM processing is described using a flowchart shown in FIG. 10. As an initial step a set of randomly generated PCM processing schedules (or orders) is generated 1002. Such initial set is commonly called an "initial population" or "initial generation". Each processing schedule in said "initial population" is a candidate solution of the clustered traveling salesman problem. A candidate solution (i.e. a processing schedule) may be represented as a two-dimensional sequence of layer indices and VNG indices that correspond to the addresses in the LLR memory. An example of a permutation matrix is shown on the top left side of FIG. 11. It is assumed for exemplary purposes that each row forms a layer. The original processing schedule 1104 may thus be a sequence of 1-dimensional arrays of VNG indices. FIG. 11, four random schedules 1106, 1108, 1110, 1112 are shown in the right half of the drawing which are found by permutation of the original processing schedule 1104. Random processing schedules 1106, 1108, 1110, 1112 may be for example generated by permuting/rearranging the order of the layers and/or permuting/rearranging the layer indices (VNG indices) within respective layers of the original processing schedule 1104.

The next step is cost calculation 1004 for each candidate solution, i.e. for each of the processing schedules in the current population. Initially, the current population is the initial population formed in step 1002. The cost calculation is equivalent to calculating the "fitness" of the processing schedules of the current population. The calculation of the costs of the processing schedules will be outlined in more detail below. An example fitness function that can be used to calculate the cost of each processing schedule is described in connection with FIG. 13. The lower the cost of a processing schedule, the better is its SNR performance and the lower is its required patch LLR memory depth.

Step 1006 checks whether one or more criteria for stopping the iterative optimization process applies. For example, it may be checked in step 1006—as one criterion—whether a predetermined or configurable maximum number of iterations has been reached. If this is the case, the processing schedule that has (or one of the processing schedules that have) the least cost may be selected 1008 for decoding. The least cost processing schedule may be selected from the current population. It may also be possible to maintain also processing schedules from one or more previous populations and to select the least cost processing schedule from a set of populations.

As an alternative criterion or as an additional criterion for interrupting the optimization process, step 1006 may check, whether the cost of one or more processing schedules in a current population meets a threshold criterion. For example, if at least one of the processing schedules in a current population has a cost value lower than a predetermined or configurable optimization threshold, the optimization process may stop and proceed to step 1008 where one of the one or more processing schedules in the current population that meets the threshold criterion is selected.

As another alternative criterion or as a further criterion for interrupting the optimization process, it may be checked in step 1006 whether there has been a further reduction of the minimum cost of the processing schedules in a given or configurable number of subsequently generated populations (i.e. in a given or configurable number of iterations). If this is not the case, one the processing schedule that has (or one of the processing schedules that have) the least cost in the generated populations may be selected 1008 for decoding.

Yet another alternative criterion or additional criterion may be to check in step 1006 if there is a processing schedule with the cost value 0. If there is a processing schedule with the cost value 0, this processing schedule yields the optimal order of processing the PCM that will be used 1008 for the decoding process.

If the optimization process is to continue (step 1006: no), candidate solutions (processing schedules) that will be used for generating the next population, i.e., the next generation of population, are selected 1010. The selection of candidate solutions, i.e. the selected processing schedules, may be selected from the processing schedules of the current population. The selected candidate solutions are commonly referred to as "parents". This selection schemes may be based on various approaches. For example, only a subset or (a given) number of processing schedules having the lowest/least costs (step 1004) are selected as "parents" for next generation, following an elitist approach. However, also other selection schemes could be used. For example, the selected "parents" may contain a number of processing schedules having the least/lowest costs and a number of randomly selected schedules. This approach may be useful to increase diversity. The number of selected "parents" may be either predetermined or may be configurable. It is also possible that the selection is based on a threshold criterion on the costs for the processing schedules. For example, processing schedules that have costs below a threshold could be selected.

The selected "parents" of step 1010 are used for generating 1012 the next, new population of processing schedules. This may involve recombination of the selected "parents" to generate new processing schedules. The new processing scheduled obtained by recombination may be further modified in a mutation process. The new processing schedules form the new population and are then passed to the cost function calculation step 1004 for calculating the costs of the processing schedules of the new population. Alternatively, the generation process 1012 may keep some (e.g. a given number or a subset of) "parents" in the new population (without recombination and mutation). An example recombination and mutation of two processing schedules in the "parents" is shown in FIG. 12. The "parents" in this example are the processing schedules 1106 and 1108 of FIG. 11. The recombination may include two operations: First, the order of layers of one of the two parent processing schedules is changed. For example, the order of layers in processing schedule 1106 is changed from L1, L2, L3, L0 to L0, L2, L3, L1 in new processing schedule 1202. Second, in each of the layers, a sub-sequence of one or more VNG index values (not including all VNG index values) from one of the parent processing schedules is copied to the same index position(s) in the new processing schedule, and the values at the remaining index positions of the new processing schedule are filled with the remaining VNG index values from the other parent processing schedule as they occur in the respective layer. For example, in each of the layers L1, L2, L3, L4 of processing schedule 1106, the position of a sub-sequence of the VNG values in processing schedule 1106 is maintained and not changed in the corresponding layer of the new processing schedule 1202, while the remaining VNG index values are taken from processing schedule 1108 and copied to the remaining index positions in the given layer of new processing schedule 1202 (e.g. in an order in which they occur in processing schedule 1108). More specifically, considering layer L2 in the new processing schedule 1202 obtained by recombination of processing schedules 1106 and 1108, the VNG index values "7" and "6" at the third and fourth index positions in processing schedule 1106 are copied to the same index positions in layer L2 of the new processing schedule 1202. The remaining index positions in layer L2 (first, second and fifth index positions) are filled with the remaining VNG index values of layer L2 in processing schedule 1108. In the example, the remaining VNG index values "2", "4" and "0" of layer L2 in processing schedule 1108 (i.e. the VNG index values other than "7" and "6") are thus copied to the first, second and fifth index positions of layer L2 in the new processing schedule 1202 as they occur in the layer L2 of processing schedule 1108. The resultant new processing schedule 1202 is thus "2", "4", "7", "6", "0", where the underlined VNG index values are taken processing schedule 1106 and the other VNG index values are taken from processing schedule 1108. Subsequently, the new processing schedule 1202 may (optionally) undergo a mutation process, which may for example involve at least one of (a) changing the order of layers or (b) exchanging index positions of VNG values in one or more layers. In the example of FIG. 12, the order of layers L3 and L1 in new processing schedule 1202 is changed as indicated in the mutated processing schedule 1204. Further, the VNG values "4" and "0" in the new processing schedule 1202 have changed position in the mutated processing schedule 1204. Step 1016 may involve several recombinations of pairs selected from the "parent" processing schedules and an optional mutation of the resultant new processing schedules so as to obtain a new given or configurable number of processing schedules that form the next/new population.

As noted, the generation of new population and calculation of the costs for the processing schedules in each population may repeat iteratively until the predefined maximum number of iterations is reached or until another criteria is met, e.g., if there is no improvement in the best solution after in a given or configurable number of subsequently generated populations (see step 1006).

The "cost" to be optimized in the optimization procedure exemplified in FIG. 10 may be—for example—the number of "outdated" LLR read operations, or equivalently the number of double writes. The "cost" may thus be a function of the processing schedule and the number of inserted pipeline stages.

Figure 13:
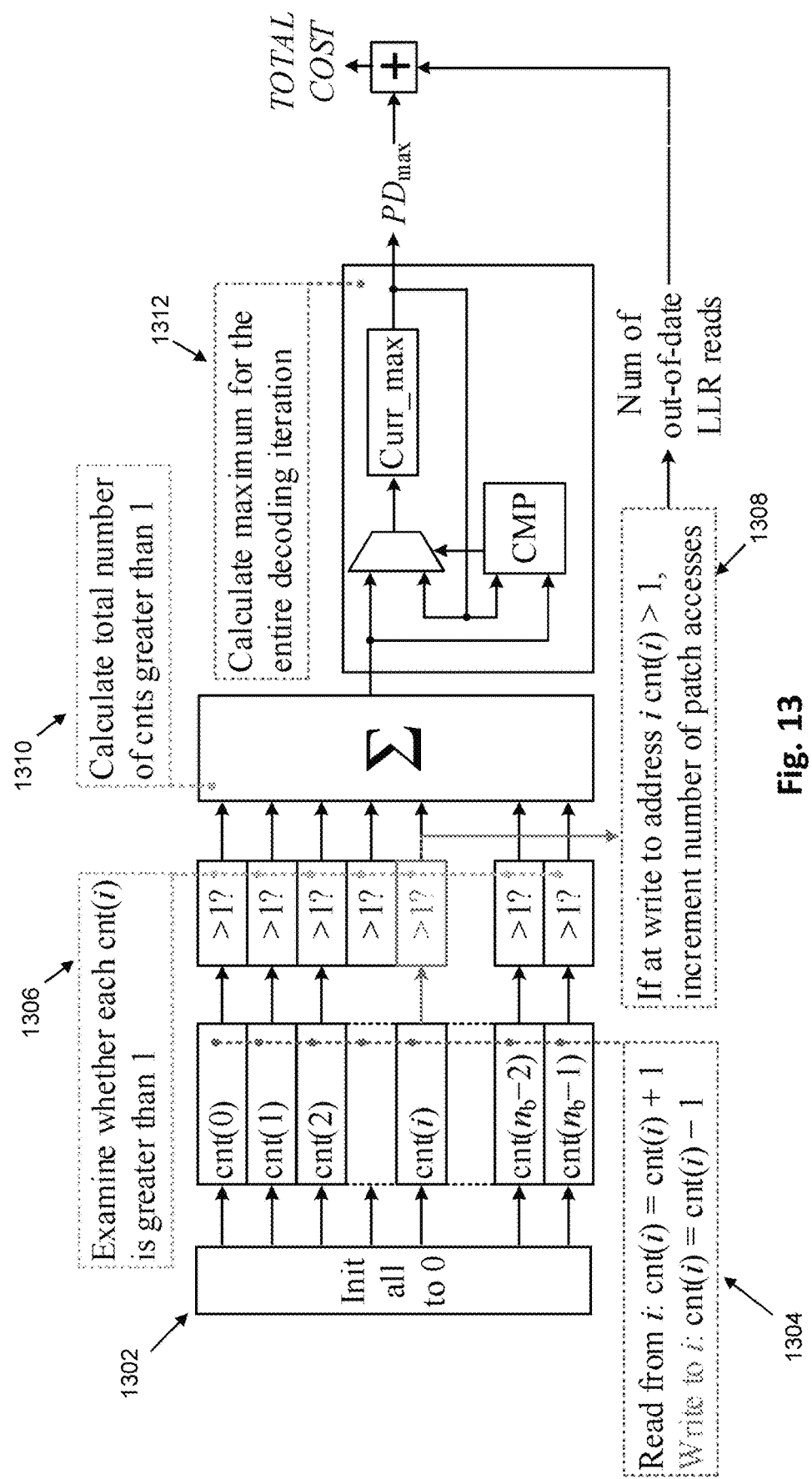
FIG. 13 shows an exemplary fitness function calculation for a genetic algorithm-based optimization of PCM processing schedule in accordance with some embodiments of the disclosure which achieves optimal signal-to-noise-ratio (SNR) performance and optimal LLR memory utilization of the decoder.

An example implementation of a proposed "fitness function" for calculating the costs of the processing schedules in step 1004 of FIG. 10 in accordance with some embodiments is shown in FIG. 13. The process in FIG. 13 allows to determine the "cost" of a given processing schedule as "TOTAL COST". The individual processing schedules of a current generation may be the input argument of the fitness function to determine their costs. For an example where a layer corresponds to a set of Z PCM rows, i.e., to a single row of circulants, the entire codeword requires $n_b=n/Z$ memory locations for storage. If a layer is only a set of Z/2 or Z/4 PCM rows, the number of memory locations for storage of a single codeword would be $2n_b$ or $4n_b$ respectively, as shown in FIG. 8. The cost may be calculated using a set of counters whose number is equal to a number of locations for storage of a codeword ($n_b$, $2n_b$, $4n_b$, etc.). Without loss of generality, FIG. 13 shows an example where the number of memory locations for storage of the entire codeword (memory depth) and the number of counters is equal to np. At the beginning an array of ng counters is populated/initialized 1302 with zeros, where ng is equal to the (configured) memory depth of the LLR memory blocks.

The method emulates LLR memory accesses using a given input processing schedule, wherein the corresponding PCM is processed layer by layer. For this emulation of LLR memory access, it is assumed that the write access is delayed by $n_{PS}+CNW_{max}$ reads, where $CNW_{max}$ is the maximum check node weight of the PCM and $n_{PS}$ is the number of pipeline stages of the decoder. Whenever a read access at address i of the LLR memory is emulated, the counter at index i is incremented 1304. Whenever a write access to address i is emulated, the counter at index i is decremented 1304. If the corresponding cnt(i) value is 1 at write access to an address i, the LLR at address i updated regularly, without requiring patch LLRs, because there was no additional LLR read of outdated data from the same address i. However, if a counter cnt(i) value is greater than 1 before write, this means that there was an outdated LLR read and that this write must be a double write, which requires a storage of a patch LLR to the buffer memory block.

At each write access to address i, the corresponding counter cnt(i) is checked 1306. If it is greater than 1, a counter that counts the total number of outdated LLR reads is incremented 1308.

After all layers of the processing schedule is processed, the cost function is updated with the total number of outdated LLR reads.

The necessary patch memory depth $PD_{max}$ is equal to the maximum number of counters that are greater than 1. Whenever any counter cnt(i) value is higher than 1, this means that LLRs from address i should also be written as patch LLRs to a buffer memory block. Essentially, the status of cnt array is the status of the number of patch LLR values held in the LLR memory block. This status changes during the decoding, but the maximum number of patch LLR values that needs to be held in the LLR memory block determines the memory depth for storing the patch LLRs. The goal of optimization process in FIG. 10 is to minimize the maximal number elements of cnt array that are greater than 1 as this reduces the number of actual physical memory location (i.e. the memory depth) necessary for storing the patch LLRs in the iterations of the decoding process of a codeword. Such constraint is not in conflict with the request for SNR performance optimization, since the SNR performance is the best when the use of patch LLR for LLR updates is low. The proposed method only favors (optimized) PCM processing schedules that also require the lowest memory utilization. In order to obtain $PD_{max}$, initially, all cnt(i) values are summed, which gives the necessary memory depth PD for the current state of the decoding process 1310. However, the PD changes during the decoding. The first PD is written to the Curr_max variable which keeps the current maximum value of the PD. If the new PD is greater than the Curr_max, the Curr_max becomes equal to PD 1312. $PD_{max}$ is equal to Curr_max in the end of the decoding. The total cost is calculated as a simple sum of the $PD_{max}$ and calculated number of out-of-date LLR reads.

The cost function as exemplified in FIG. 13 can be applied to any other optimization algorithm suitable for a class of clustered traveling salesman problem (CTSP) and is not limited to being used in combination with a genetic algorithm as discussed in connection with FIG. 10. The use of a genetic algorithm-based approach of optimizing the PCM processing schedule is therefore just one example and other algorithms could also be used for optimization of the PCM processing schedule.

Further, the disclosure is not limited to the decoding of QC-LDPC codes only but may be applied to the decoding of LDPC codes that can be structured to look like quasi-cyclic, e.g., irregular repeat-accumulate (IRA) LDPC codes such as those defined in DVB-S2/-T2/-C2 or DVB-S2X standards. Most structured LDPC codes are designed so that they are quasi-cyclic or that can be treated as quasi-cyclic. To apply the disclosure to this class of LDPC codes, usually it is only necessary to permute columns and rows of the PCM. This way, the obtained LDPC code is equivalent to the original code and has the same error correcting performance. In order to support such permutation, it is necessary to permute input LLRs prior to writing to the LLR memory using the same permutation pattern used for PCM permutation, and to do an inverse permutation when decoded bits are read from the LLR memory after the decoding process is finished. Some structured LDPC codes have so-called multi-diagonal circulants that represent a sum of multiple cyclically shifted circulants. The decoder presented in the disclosure inherently supports such structure and the decoder would separate a multi-diagonal circulant to multiple single-diagonal circulants, which are processed in the same layer like in the same manner as all other circulants.

Furthermore, in several embodiments it has been assumed that the layers of the PCM have a column weight of 1, so that one variable-to-check message is calculated per variable node in processing a single layer. However, the disclosure can also be extended to LDPC codes where layers of the PCM may have a column weight that is larger than 1. In this case, the LLR update unit would have to calculate multiple $\Delta M_{c2v}$ contributions for each circulant in a layer that correspond to the same VNG index and sum them before the patched LLR update.

While the embodiments set forth in this disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The invention claimed is:

1. An apparatus implementing a decoder with a layered decoder structure and the decoder configured to decode a sequence of codewords encoded with a low-density parity-check (LDPC) code using an iterative hybrid decoding algorithm, wherein the iterative hybrid decoding algorithm is based on passing messages between variable nodes and check nodes to decode a current codeword of the sequence of codewords in layers, the layers corresponding to portions of a parity check matrix (PCM) describing the LDPC code, wherein the iterative hybrid decoding algorithm includes a plurality of updates of log-likelihood ratios (LLRs) of a current codeword in decoding the current codeword, the apparatus comprising:

an LLR update unit implemented by processing elements and configured to calculate, in processing a current layer of said layers of the PCM, updated LLRs of the current codeword for those variable nodes for which the current layer of the PCM includes non-zero entries; and an LLR memory, which is divided into a first memory block and a second memory block, wherein the first memory block is to store the most recent updated LLRs of the current codeword, and the second memory block stores LLRs of the next codework and, as patch LLRs, the most recent updated LLRs associated with a subset of the variable nodes for which a PCM processing schedule yields that variable-to-check messages from said associated variable nodes calculated in processing the current layer are not based on the most recent LLRs; and wherein each of the first and second memory blocks comprises a first memory portion having a number of bits equal to the number of bits required to store the values of the LLRs of the current or next codeword, respectively, and a second portion having a number of bits that is smaller than that of the first portion to store said patch LLRs for the variable nodes prior to their update.

2. The apparatus according to claim 1, further comprising a controller configured to cause storage of an updated LLR for a variable node that is updated by the LLR update unit in processing a previous layer in the LLR memory, wherein said updated LLR for said variable node is stored:

as one of the most recent updated LLRs of the current codeword in the first memory block only, if PCM processing schedule yields that a variable-to-check message from said variable node calculated in processing the current layer is based on the most recent LLR associated with said variable node; and as one of the most recent updated LLRs of the current codeword in the first memory block and as one of the patch LLRs in the second memory block, if PCM processing schedule yields that a variable-to-check message from said variable node calculated in processing the current layer is not based on the most recent LLR associated with said variable node.

3. The apparatus according to claim 1, wherein the PCM processing schedule is an optimized PCM processing schedule that is optimized based on an algorithm suitable for solving a clustered traveling salesman problem (CTSP), such as for example a genetic algorithm (GA).

4. The apparatus according to claim 1, wherein the PCM processing schedule is an optimized PCM processing schedule that yields a minimum number of variable-to-check messages from variable nodes calculated in processing all layers that are not based on the most recent LLR associated with said variable node; or wherein the PCM processing schedule is an optimized PCM processing schedule that yields a minimum number of patch LLRs that need to be stored concurrently for processing all layers in decoding the current codeword.

5. The apparatus according to claim 1, wherein the apparatus is implemented in a field-programmable gate array (FPGA) or a programmable logic device (PLD); and wherein the first and second memory blocks of the LLR memory are realized by equal numbers of fixed-size block RAMs, wherein the number of bits that can be stored in said number of block RAMs is smaller than the size of two times the bits required to store LLRs of the largest codeword length to be decoded by the apparatus.

6. The apparatus according to claim 1, wherein the apparatus is implemented in an application specific integrated circuit (ASIC); and wherein the first and second memory blocks of the LLR memory is realized by memory elements provided in the ASIC, wherein the number of bits that can be stored in the second memory block is smaller than the size of the bits required to store LLRs of the largest codeword length to be decoded by the apparatus.

7. The apparatus according to claim 1, wherein the apparatus is configured to access the second portion of the memory block using a virtual addressing scheme.

8. The apparatus according to claim 1, wherein the apparatus is configured to:

when the current codeword of said sequence of codewords is an odd codeword, store the updated LLRs of the odd codeword in a first memory block, and to store the LLRs of the next even codeword and said patch LLRs in the second memory block; and when the current codeword of said sequence of codewords is an even codeword, store the updated LLRs of the odd codeword in the second memory block, and store the LLRs of the next even codeword and said patch LLRs in the first memory block; and further optionally:

when the current codeword of said sequence of codewords is an odd codeword, read the updated LLRs of a previous even codeword from the second memory block, and to subsequently store the LLRs of the next even codeword in the second memory block, while decoding the odd codeword; and when the current codeword of said sequence of codewords is an even codeword, read the updated LLRs of a previous odd codeword from the first memory block, and to subsequently store the LLRs of the next odd codeword in the first memory block, while decoding the even codeword.

9. The apparatus according to claim 1, wherein the LLR update unit is configured to calculate, in a current iteration, one or more updated LLRs for each of the variable nodes by either:

adding a variable-to-check message from the respective variable node generated in processing of the current layer in the current iteration and a check-to-variable message to the respective variable node in the current iteration, if PCM processing schedule yields that a variable-to-check message from the respective variable node calculated in processing the current layer is based on the most recent LLR associated with said variable node; or adding a patch LLR corresponding to the respective variable node received from the second memory block of the LLR memory and a difference between the check-to-variable message to the respective variable node generated in the current iteration and a check-to-variable message to the respective variable node generated in a previous iteration, if PCM processing schedule yields that a variable-to-check message from the respective variable node calculated in processing the current layer is not based on the most recent LLR associated with said variable node.

10. The apparatus according to claim 1, further comprising:

variable node units (VNUs) implemented using processing elements, wherein the VNUs are configured to load current LLRs of the current codeword from the first memory block of the LLR memory and to calculate variable-to-check messages based on the loaded current LLRs corresponding to the respective variable nodes and check-to-variable messages to the respective variable nodes calculated in the previous iteration; and check node units (CNUs) implementing the check nodes using processing elements and configured to receive, in the current iteration, the variable-to-check messages from the VNUs, and to calculate check-to-variable messages of the current iteration based on variable-to-check messages received from the VNUs.

11. The apparatus according to claim 10, wherein each of the VNUs comprises a multiplexer circuit that selectively outputs the variable-to-check message of the current iteration or a negated check-to-variable message of the previous iteration, wherein the apparatus further comprises a comprising FIFO buffer to receive from the VNUs the variable-to-check messages from the VNUs of the current iteration or the negated check-to-variable message of the previous iteration from the multiplexer circuit.

12. The apparatus according to claim 1, wherein the LLR update unit is configured to update the current LLRs without stalling execution cycles or postponing the LLR updates.

13. The apparatus according to claim 1, further comprising a FIFO buffer to selectively store, for the variable nodes, a check-to-variable message to a respective variable node generated in a previous iteration, if PCM processing schedule yields that a variable-to-check message from the respective variable node calculated in processing the current layer is not based on the most recent LLR associated with said respective variable node or said variable-to-check message from the respective variable node generated in processing of the current layer in the current iteration, if PCM processing schedule yields that said variable-to-check message from the respective variable node calculated in processing the current layer is based on the most recent LLR associated with said respective variable node; and wherein the LLR update unit is to receive either said check-to-variable message to the respective variable node generated in a previous iteration from the FIFO buffer, if PCM processing schedule yields that a variable-to-check message from the respective variable node calculated in processing the current layer is not based on the most recent LLR associated with said respective variable node, or said variable-to-check message from the respective variable node generated in processing of the current layer in the current iteration, if PCM processing schedule yields that the variable-to-check message from the respective variable node calculated in processing the current layer is based on the most recent LLR associated with said respective variable node.

14. An apparatus implementing a decoder with a layered decoder structure and the decoder configured to decode a sequence of codewords encoded with a low-density parity-check, LDPC, code using an iterative hybrid decoding algorithm, wherein the iterative hybrid decoding algorithm is based on passing messages between variable nodes and check nodes to decode a current codeword of the sequence of codewords in layers, the layers corresponding to portions of a parity check matrix, PCM, describing the LDPC code, wherein the iterative hybrid decoding algorithm includes a plurality of updates of log-likelihood ratios, LLRs, of a current codeword in decoding the current codeword, the apparatus comprising:

an LLR update unit implemented by processing elements and configured to calculate, in processing a current layer of said layers of the PCM, updated LLRs of the current codeword for those variable nodes for which the current layer of the PCM includes non-zero entries; and an LLR memory, which is divided into a first memory block, a second memory block and a third memory block, wherein the first memory block is to store the most recent updated LLRs of the current codeword, the second memory block is to store the LLRs of the next codeword, and the third memory block stores, as patch LLRs, the most recent updated LLRs associated with a subset of the variable nodes for which a PCM processing schedule yields that variable-to-check messages from said associated variable nodes calculated in processing the current layer are not based on the most recent LLRs, and wherein the number of bits that can be stored in the first and second memory blocks, respectively, is the number of bits required to store LLRs of the largest codeword length to be decoded by the apparatus, and the number of bits that can be stored in the third memory block is smaller than the number of bits that can be stored in the first and second memory blocks, respectively.

* * * * *